United States Patent [19]
Shimada et al.

[11] Patent Number: 5,923,637
[45] Date of Patent: Jul. 13, 1999

[54] METHOD OF MANUFACTURING MICRO-TIP FOR DETECTING TUNNELING CURRENT OR MICRO-FORCE OR MAGNETIC FORCE

[75] Inventors: Yasuhiro Shimada, Hadano; Takayuki Yagi, Yokohama; Tsutomu Ikeda, Hachioji, all of Japan

[73] Assignee: Canon Kabushiki Kaisha, Tokyo, Japan

[21] Appl. No.: 08/715,391

[22] Filed: Sep. 13, 1996

[30]  Foreign Application Priority Data

| Sep. 14, 1995 | [JP] | Japan | 7-262131 |
| Sep. 14, 1995 | [JP] | Japan | 7-262356 |
| Jan. 18, 1996 | [JP] | Japan | 8-024732 |
| Jan. 19, 1996 | [JP] | Japan | 8-026116 |
| Aug. 23, 1996 | [JP] | Japan | 8-241346 |

[51] Int. Cl.$^6$ .............................. G11B 9/00; G02B 21/00
[52] U.S. Cl. .......................... 369/126; 250/306; 437/228
[58] Field of Search ........................... 369/126; 250/306; 437/228

[56]  References Cited

U.S. PATENT DOCUMENTS

| 5,221,415 | 6/1993 | Albrecht et al. | 156/629 |
| 5,260,567 | 11/1993 | Kuroda et al. | 250/227 |
| 5,272,913 | 12/1993 | Toda et al. | 73/105 |
| 5,317,152 | 5/1994 | Takamatsu et al. | 250/306 |
| 5,357,108 | 10/1994 | Suzuki et al. | 250/306 |
| 5,546,375 | 8/1996 | Shimada et al. | 369/126 |
| 5,574,279 | 11/1996 | Ikeda et al. | 250/306 |
| 5,648,300 | 7/1997 | Nakayama et al. | 437/228 |

FOREIGN PATENT DOCUMENTS

| 0 763 844 A1 | 3/1997 | European Pat. Off. . |
| 41 26 151 A1 | 3/1992 | Germany . |
| 63-161552 | 7/1988 | Japan . |
| 06-084455 | 3/1994 | Japan . |

OTHER PUBLICATIONS

Journal of Applied Physics, vol. 47, No. 12, "Physical properties of thin–film field emission cathodes with molybdenum cones," C.A. Spindt et al., (Dec. 1976).

Physical Review Letters, vol. 49, No. 1, "Surface Studies by Scanning Tunneling Microscope," G. Binning et al., (Jul. 5, 1982).

"Magnetic Micro–Actuator", K. Yanagisawa et al., Proceedings of the Workshop on Micro Electro Mechnical Systems: An Investigation of Micro Structures, Sensors, Actuators, Machines and Robots, Nara, Jp., Jan. 30–Feb. 2, 1991, No. Workshop 4, Jan. 30, 1991, IEEE, pp. 120–124.

*Primary Examiner*—Tod R. Swann
*Assistant Examiner*—Kim-Kwok Chu
*Attorney, Agent, or Firm*—Fitzpatrick, Cella, Harper & Scinto

[57]  ABSTRACT

A micro-tip for detecting tunneling current, micro force or magnetic force is manufactured as follows. A recess portion is formed on the surface of a first substrate. A peeling layer are formed on the substrate including the recess of the first substrate. A micro-tip is formed on the peeling layer of the first substrate. A joining layer is formed on a second substrate. The micro-tip on the peeling layer including the recess in the first substrate is transferred onto the joining layer on the second substrate. The peeling layer mainly consists of an oxide or a nitride, of a metal element, a semi-metal element or a semiconductor element.

37 Claims, 22 Drawing Sheets

FIG. 4
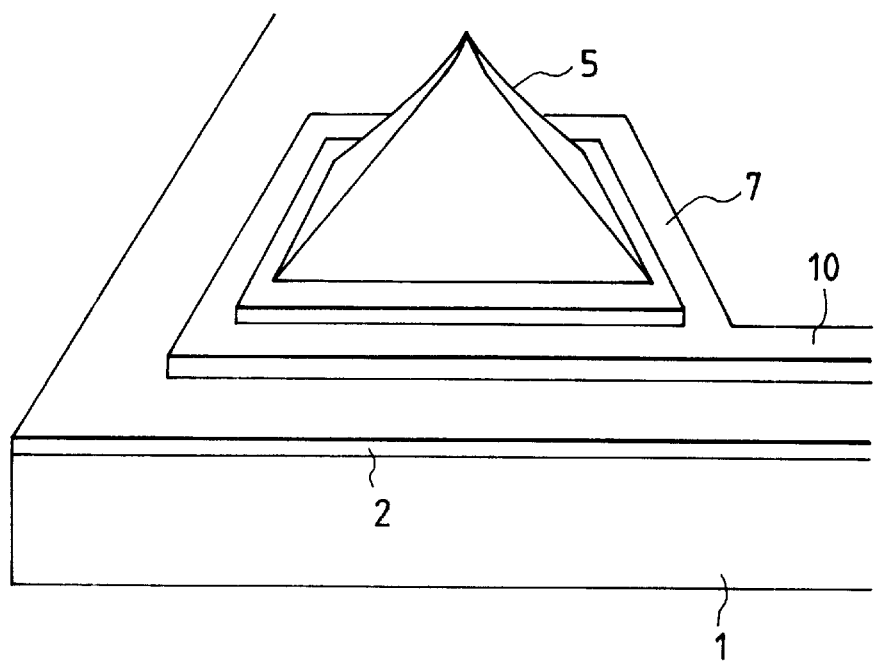
FIG. 5
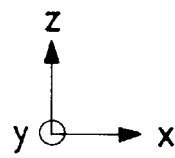
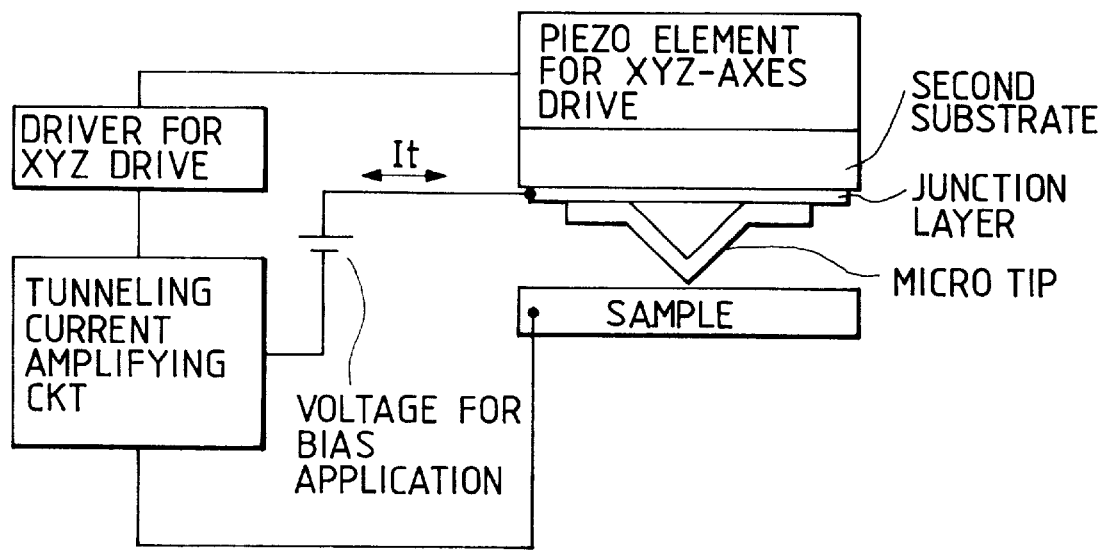

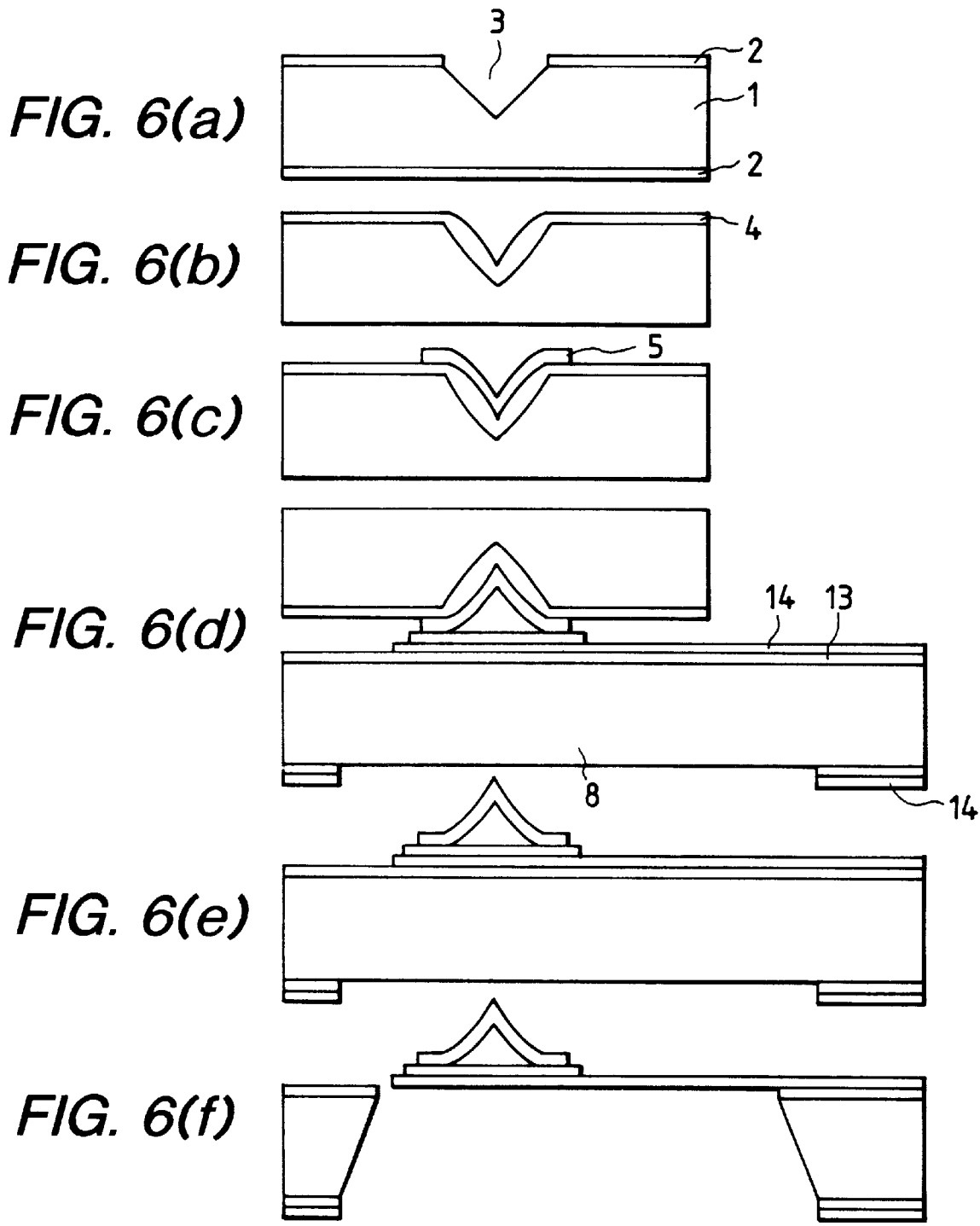

FIG. 22(a)
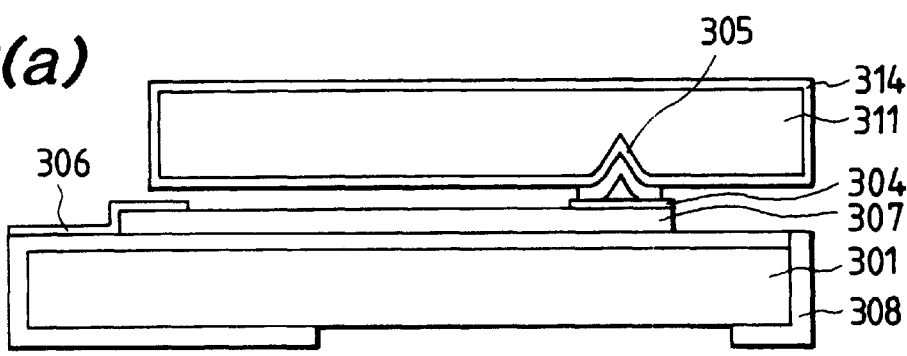
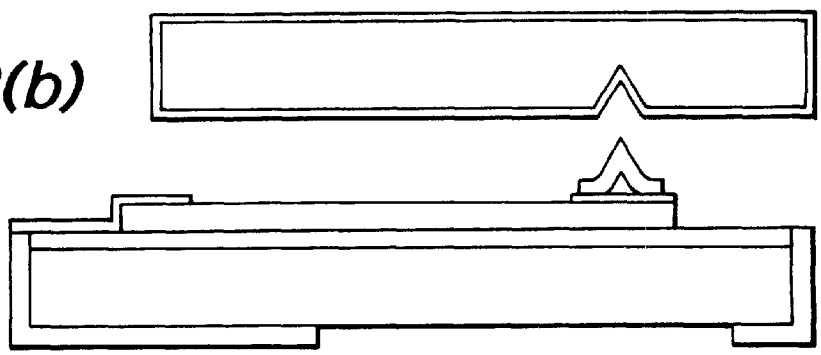
FIG. 22(b)

1

METHOD OF MANUFACTURING MICRO-TIP FOR DETECTING TUNNELING CURRENT OR MICRO-FORCE OR MAGNETIC FORCE

BACKGROUND OF THE INVENTION

1. Field of the Invention

The present invention relates to a method of manufacturing a micro-tip for detecting tunneling current, micro-force or magnetic force, a female mold substrate for the manufacture thereof, a method of manufacturing a probe with such a micro-tip, a probe unit, a scanning probe microscope and an information recording/reproduction apparatus having such a probe.

2. Related Background Art

In recent years, a scanning tunneling microscope (hereinafter abbreviated as an "STM") that allows direct observation of the electron structures of atoms on conductor surfaces has been developed (G. Binnig et al., Phys. Rev. Lett., 49, 57 (1982)), and a real space image can now be measured at a high resolution, irrespective of whether single-crystal or amorphous materials.

In addition, such scanning tunneling microscope has an advantage of permitting observation with a low electric power without damaging the specimen tending to be damaged by current, and of being applicable in the open air and to various materials. It is therefore expected to be applied in a wide range of uses.

Such STM utilizes a tunneling current that flows across a metal tip and a conductive material when a voltage is applied across them and the tip is brought close to a distance of about 1 nm to the conductive material.

This current is very sensitive to a change in distance between the tip and the conductive material, and changes exponentially. Accordingly, by scanning the tip to maintain a constant tunneling current, the surface structure of a real space can be observed at a resolution on the atomic order.

Objects that can be analyzed using the STM are limited to conductive materials. Recently however, the STM is often applied to structural analysis of a thin insulating layer formed on the surface of a conductive material.

Furthermore, the above-mentioned device and means allow observation of a medium with low electric power without damaging it since they use a method of detecting a very weak current.

Because the STM can operate in the open air, extensive studies have been made for its application to various fields such as observation/evaluation and micropatterning of semiconductors or polymers on the atomic or molecular order (E. E. Ehrichs, Proceedings of 4th International Conference on Scanning Tunneling Microscopy/Spectroscopy, "89, S13-3), an information recording/reproduction apparatus, and the like, using the STM technique.

For example, upon applying the STM to an information recording/reproduction apparatus, the distal end portion of a tip of the STM preferably has a small radius of curvature to attain a high recording density. At the same time, in view of improvement in function, especially, an increase in speed of the recording/reproduction system, it is proposed to simultaneously drive a large number of probes (multi-tip structure). For this purpose, however, tips having uniform characteristics must be manufactured on a single substrate.

An atomic force microscope (hereinafter abbreviated as an "AFM") can measure a three-dimensional pattern image on the specimen surface, irrespective of whether conductors or insulators, since it can detect a repulsive force or an attractive force acting on the surface of a substrate.

The AFM uses a micro-tip formed on the free end of a thin-film cantilever. As in the STM, in order to increase resolution of the AFM, the distal end portion of the tip is required to have a small radius of curvature.

Furthermore, there is available a multi-functional microscope known as a composite scanning atomic force/tunneling microscope (AFM/STM) for conducting AFM and STM observation on a single microscope.

According to this microscope, the probe used in AFM comprises a cantilever and a tip held by this cantilever, and it is possible to detect current flowing between the tip and a sample by using a conductive tip.

In an ordinary usage, current is detected by applying bias between the tip and the sample upon operation of AFM, thereby making it possible to simultaneously obtain a surface irregularity image and a tunneling current distribution image with the same tip.

In this composite machine, also, an information recording/reproduction apparatus for writing information to be recorded in a local area is considered by the utilization of the accessibility of a tip to the sample surface at an atomic level. In this case, use of a plurality of probes is required for increasing the write or read speed.

The magnetic force microscope (MFM) is to measure the leak magnetic field distribution two-dimensionally and three-dimensionally in a non-destructive manner by detecting a force acting between the sample of a magnetic material such as a magnetic recording medium or a magnetic head with the use of a spring-acted probe comprising a magnetic material. A probe for MFM comprises a micro-tip having a sharp distal end portion and a cantilever, in which the micro-tip or the micro-tip and the cantilever has or have a magnetic layer. Apart from the structural evaluation of the sample, applicability of MFM to an information storing apparatus which records information directly in a magnetic recording medium using a produced magnetic field of the tip is studied (T. Okubo et al., IEEE Trans. Magn. MAG-27(6), pp. 5286–5288, 1991). When considering application to structural evaluation or to an information recording/reproduction apparatus, the radius of curvature of the distal end portion of the tip of MFM should preferably be small to achieve a high resolution and a high recording density.

As a conventional method of forming the foregoing micro-tip formed by anisotropic etching of monocrystalline silicon using a semiconductor manufacturing process is known (U.S. Pat. No. 5,221,415).

In the method of forming a micro-tip, as shown in FIG. 1, a pit 518 is formed by anisotropic etching on a silicon wafer 514 coated with silicon dioxide masks 510 and 512, and is used as a female mold of a tip. After the silicon dioxide masks 510 and 512 are removed, the two surfaces of the wafer 514 are coated with silicon nitride layers 520 and 521 to form a pyramid-shaped pit 522 which is to serve as a cantilever and a micro-tip. After the pit 522 is patterned into a cantilever shape, the silicon nitride layer 521 on the rear surface is removed. Then, a glass plate 530 with a saw-cut 534 and a Cr layer 532 is joined to the silicon nitride layer 520. Thereafter, the silicon wafer 514 is removed by etching, thus manufacturing a probe which is transferred to a mounting block 540 and is constituted by the silicon nitride tip and the cantilever. Finally, a metal film 542 serving as a reflection film for an optical lever type AFM is formed.

When this is used for MFM, it suffices to form a magnetic layer 543 by the use of the vacuum vapor deposition method on the surface of the foregoing probe. Similar examples in which a magnetic layer is formed by the vacuum vapor deposition method on the surface of a probe comprising silicon dioxide as formed on Si include an MFM proposed by A. Kikukawa et al. (Appl. Phys. Lett. Vol. 61 (21), Nov. 23, 1992, pp. 2067–2069), and that proposed by Hosaka et al. (Proc. 1992 Precision Eng. Society Fall Conf., H22, pp. 277–278).

Also, the following methods are available. That is, in another manufacturing method, as shown in (a) in FIG. 2, a thin film layer 202 on a silicon substrate 201 is patterned into a circular shape, the substrate 201 is etched using the patterned thin film layer as a mask, and a tip 203 is formed by utilizing side etching (O. Wolter, et al., "Micromachined silicon sensors for scanning force microscopy," J. Vac. Sci. Technol. B9(2), Mar/Apr., 1991, pp. 1353–1357). In still another manufacturing method, as shown in (b) in FIG. 2, a conductive material 207 is obliquely deposited onto a substrate 204 via a reverse-tapered resist aperture portion 206 of a resist film 205 while rotating the substrate 204, and is lifted off, thereby forming a tip 208 (C. A. Spindt, et al., "Physical properties of thin film field emission cathode with molybdenum cones," J. Appl. Phys., 47, 1976, pp. 5248–5263).

There is also available a probe for detecting magnetic force, formed by this method (K. Yanagisawa, et al., "Magnetic Micro-Actuator," Proceedings IEEE Micro Electro Mechanical Systems, 1991, pp. 120–123). It is now possible to form a probe having desired properties of those materials including a magnetic material having a large coercive force to which any magnetizing direction can be imparted through magnetization, and a magnetic material having a small coercive force in contrast in which the magnetizing direction can be directed in the measuring magnetic field direction, by the application of these methods, as probes for detecting magnetic force applicable in MFM and the like.

However, the conventional micro-tip manufacturing method suffers the following problems:

For example, the conventional micro-tip manufacturing method shown in FIG. 1 suffers the following problems:

(1) Since the silicon substrate used as a female mold of a tip is removed by etching in a subsequent process, it cannot be reused, resulting in a lower productivity and a higher manufacturing cost.

(2) Since the silicon substrate used as a female mold of a tip is etched, deterioration of the tip material and the tip shape on the probe surface due to an etchant, and contamination from the etchant occur.

(3) When a tip for the STM is manufactured by coating the tip surface with a conductive material, since the tip is formed to have a sharp distal end, it is not easy to form a coating of the conductive material. When the tip surface is coated with the conductive material, grain clots of the conductive film appear, and it is difficult to control the grain clots with a high reproducibility.

(4) Furthermore, when a micro-tip is formed on a thin-film cantilever, a reflection film is formed on the entire rear surface of a probe in an AFM, and the cantilever warps due to the film stress of the reflection film. Conventional films of $SiO_2$, SiN, SiC and C formed by vacuum vapor deposition or the CVD method are polycrystalline or amorphous and contain considerable internal stress, resulting in a problem of occurrence of warp in the level itself. When there are fluctuations in the lever caused by warp, use of a plurality of probes leads to different loads for the individual probes relative to the recording medium, and depending upon the extent of load, there may occur a decrease in resolution or destruction of the recording medium or the tip.

When causing a thick substrate such as an Si one to hold a portion of a thin-film lever comprising $SiO_2$ or SiN, a stress is produced at the laminating portion of the substrate and the film, and the stress concentrates particularly on the base portion of the lever. If the lever is operated repeatedly, therefore, breakage is caused at this portion.

Furthermore, when information is recorded through application of voltage onto the recording medium by means of a probe comprising the cantilever and the substrate holding it, the entire surface of which is coated with a conductive material, the cantilever and the entire surface of the substrate holding it serve as an electrode. A floating capacity is therefore produced between this electrode and the recording medium, thus resulting in a problem of a delay in the application time of voltage.

(5) The conventional method of manufacturing a micro-probe for detecting magnetic force comprises the step of forming a magnetic material layer on the entire surface of a probe by the vacuum vapor depositing method. When the cantilever is brought closer to the sample, therefore, not only the probe but also the magnetic material layer formed on the cantilever may be susceptible to leak magnetic field, and this causes an increase in noise of the detection signal.

For the purpose of inhibiting warp of the cantilever caused by the film stress of the magnetic material layer resulting from formation of the magnetic material layer over the entire surface of the cantilever, the magnetic material layer should be a thin film having a thickness within a range of from several to several tens of nm, thus leading to a lower detection sensitivity of magnetic force.

When the surface of the probe is coated with the magnetic material layer to serve as a probe for MFM, the distal end portion of the probe is formed into a sharp shape. This makes it difficult to coat it with a magnetic material, and when actually coating same, grain clots of the formed magnetic material layer appear, and it is difficult to control the grain clots with a high reproducibility.

The conventional micro-tip manufacturing method shown in FIG. 2 suffers the following problem:

(6) Strict process management is required to make constant the etching condition for silicon upon forming a tip, the patterning condition for a resist, the deposition condition of a conductive material, and it is difficult to maintain accurate shapes such as the heights, the radii of curvature of distal ends, and the like of a plurality of micro-tips to be formed.

(7) Particularly when a cantilever-shaped probe coated with a conductive material is used as an STM probe, the distal end portion of the tip is formed into a sharp shape, so that it is difficult to coat it, and in STM handling a weak current called tunneling current, it is difficult to obtain stable properties.

SUMMARY OF THE INVENTION

It is therefore an object of the present invention to provide a method of manufacturing a micro-tip for detecting tunneling current, micro-force or magnetic force, a female mold substrate for the manufacture thereof, a method of manufacturing a probe with such a micro-tip, a probe unit, a scanning probe microscope and an information recording/reproduction apparatus having such a probe, which can solve the various problems of the conventional micro-tip manufacturing method, permit forming a micro-tip without removing the female mold of the micro-tip by etching in a subsequent process, allow reuse of a female mold used in the manufacture of a micro-tip, thereby improving productivity and reducing the manufacturing cost.

Another object of the present invention is to obtain a construction which permits formation of micro-tip free from deterioration of the material and the shape of a micro-tip and contamination from an etchant.

Still another object of the present invention is to obtain a construction which permits use of a metal material for a micro-tip and can obviate the need for coating the micro-tip with a conductive thin film.

Further another object of the present invention is to obtain a construction which permits formation of a micro-tip only at the distal end of the cantilever, and does not require formation of a reflection film on the entire rear surface of a probe.

Further another object of the present invention is to obtain a construction which provides a uniform shape with a high reproducibility, permits forming the distal end into a sharp shape, and allows easy achievement of a multi-tip structure.

Finally, further another object of the present invention is to provide a method of manufacturing a probe which is free from a warp or breakage of the lever, allows reduction of floating capacitance produced between the micro-tip and the recording medium, and permits easy junction and formation of micro-tip with a high reproducibility.

In order to achieve the above objects of the present invention, there is provided a method of manufacturing a micro-tip for detecting tunneling current, micro-force or magnetic force, which comprises the steps of:

forming a recess portion on the surface of a first substance;

forming a peeling layer on the substrate containing the recess of the first substrate;

forming a micro-tip on the peeling layer of the first substrate;

forming a joining layer on a second substrate; and transferring the micro-tip on the peeling layer containing the recess in the first substrate onto the joining layer on the second substrate;

wherein, the peeling layer mainly consists of a metal element, a semi-metal element, a semiconductor element, an oxide of any thereof, or a nitride of any thereof.

There is provided, to achieve the above objects, a female mold substrate used for manufacturing a micro-tip for detecting tunneling current, micro-force or magnetic force, which comprises:

a recess formed on the surface of the female mold substrate; and a peeling layer provided on the substrate containing the recess;

wherein the peeling layer mainly consists of an oxide or a nitride, of a metal element, a semi-metal element or a semiconductor element.

There is provided, to achieve the above objects, a probe provided with a micro-tip for detecting tunneling current, micro-force or magnetic force, which comprises:

a lever formed on a substrate;

a joining layer formed on the lever; and a micro-tip formed on the joining layer;

wherein a hollow space is present between the joining layer and the micro-tip.

There is provided, to achieve the above objects, a method of manufacturing a probe having a micro-tip for detecting tunneling current, micro-force or magnetic force, which comprises the steps of:

forming a recess on the surface of a first substrate comprising silicon;

forming a peeling layer on the substrate containing the recess of the first substrate;

forming a micro-tip on the peeling layer of the first substrate;

forming a layer comprising an elastic material on a second substrate;

forming a joining layer on the layer comprising the elastic material of the second substrate;

transferring the micro-tip formed on the first substrate onto the joining layer on the second substrate; and removing part of the second substrate to form an elastic member comprising the elastic material;

wherein the peeling layer mainly consists of an oxide or nitride, of a metal element, a semi-metal element or a semiconductor element.

There is provided, to achieve the above objects, a method of manufacturing a probe having a micro-tip for detecting tunneling current, micro-force or magnetic force, which comprises the steps of:

forming a recess on the surface of a first substrate comprising silicon;

forming a peeling layer on the surface containing the recess of the first substrate;

forming a micro-tip on the peeling layer of the first substrate;

forming a joining layer comprising a resin film on a second substrate and/or on a third substrate having a beam pattern formed thereon;

binding the second substrate and the third substrate together via the joining layer;

shaping the third substrate into a flat thin film on the second substrate;

forming a joining layer on the flat thin film;

forming a supporting portion, which supports the flat thin film on the second substrate, on the second substrate;

transferring the micro-tip on the first substrate onto the joining layer on the flat thin film; and removing the joining layer between the second substrate and the flat thin film, to form a gap between the flat thin film and the second substrate;

wherein the peeling layer mainly consists of an oxide or nitride, of a metal element, a semi-metal element or a semiconductor element.

There is provided, to achieve the above objects, a method of manufacturing a probe having a micro-tip for detecting tunneling current, micro-force or magnetic force, which comprises the steps of:

forming a recess on the surface of a first substrate comprising silicon;

forming a peeling layer on the surface containing the recess of the first substrate;

forming a micro-tip on the peeling layer of the first substrate;

forming a lever comprising monocrystalline Si through the peeling layer on a second substrate comprising a monocrystalline Si material;

forming a joining layer on the lever;

transferring the micro-tip onto the joining layer; and removing the second substrate and the peeling layer on the back of the lever, to form a gap on the back of the lever;

wherein the peeling layer mainly consists of an oxide or nitride, of a metal element, a semi-metal element or a semiconductor element.

There is provided, to achieve the above objects, a probe unit provided with a micro-tip for detecting tunneling current, micro-force or magnetic force, which comprises:

- a monocrystalline Si substrate having a signal processing IC formed thereon;
- an insulating layer formed on the substrate;
- a lever comprising monocrystalline Si partially supported by the insulating layer; and
- a micro-tip, comprising a metal, arranged on the lever through a joining layer; and
- an electric wiring for transmitting a signal detected by the micro-tip to the IC,
- wherein a hollow space is present between the micro-tip and the joining layer.

There is provided, to achieve the above objects, a scanning probe microscope scanning a sample with a probe, and detecting a physical phenomenon occurring between the probe and the sample, thereby permitting observation of the sample, which comprises:

- a monocrystalline Si substrate having a signal processing IC formed thereon;
- an insulating layer formed on the substrate;
- a lever comprising monocrystalline Si partially supported by the insulating layer;
- a micro-tip comprising a metal, arranged through a joining layer on the lever; and
- an electric wiring for transmitting a signal detected by the micro-tip to the IC;
- wherein a hollow space is present between the micro-tip and the joining layer.

There is provided, to achieve the above objects, an information recording/reproduction apparatus recording and reproducing information with a recording medium, by scanning said recording medium with a probe and utilizing a physical phenomenon occurring between said probe and said recording medium, which comprises:

- a monocrystal Si substrate having a signal processing IC formed thereon;
- an insulating layer formed on said substrate;
- a lever comprising monocrystal Si partially supported by said insulating layer;
- a micro-tip, comprising a metal, arranged on said lever through a joining layer; and
- an electric wiring for transmitting a signal detected by the micro-tip to the IC;
- wherein a hollow space is present between said micro-tip and said joining layer.

BRIEF DESCRIPTION OF THE DRAWINGS

FIG. 4 illustrates the probe according to the first embodiment of the present invention;

FIG. 5 is a block diagram of an STM apparatus using the probe according to the first embodiment of the present invention;

FIG. 6 illustrates a method of manufacturing a probe according to a second embodiment of the present invention;

FIG. 10A is a perspective view thereof, and FIG. 10B is a sectional view of FIG. 10A cut along the line 10B—10B;

FIG. 22 illustrates manufacturing steps of the probe of the present invention;

DESCRIPTION OF THE PREFERRED EMBODIMENTS

Figure 1A:
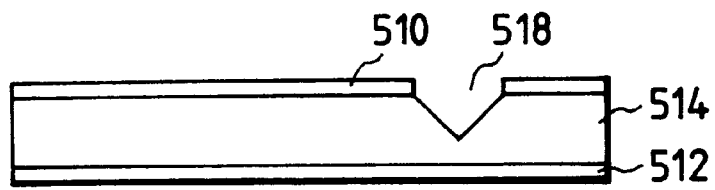
FIG. 1 is a sectional view illustrating principal steps in the conventional method of manufacturing a micro-tip.
Figure 1B:
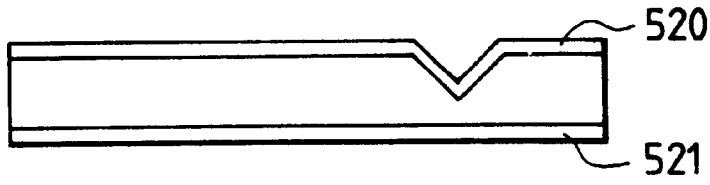
Figure 1C:
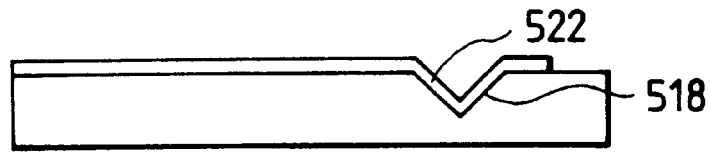
Figure 1D:
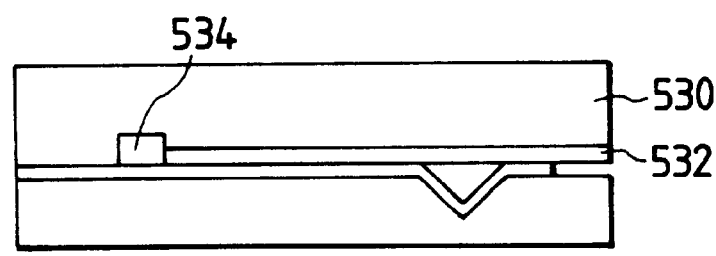
Figure 1E:
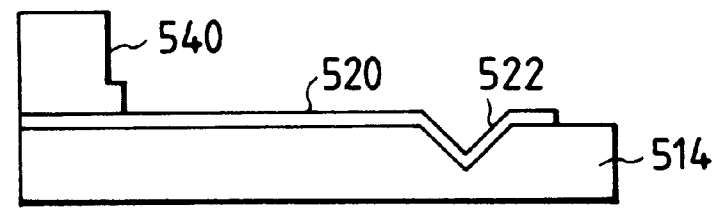
Figure 1F:
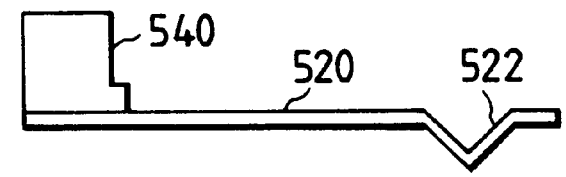
Figure 1G:
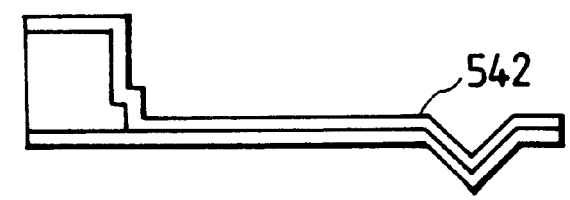
Figure 2A:
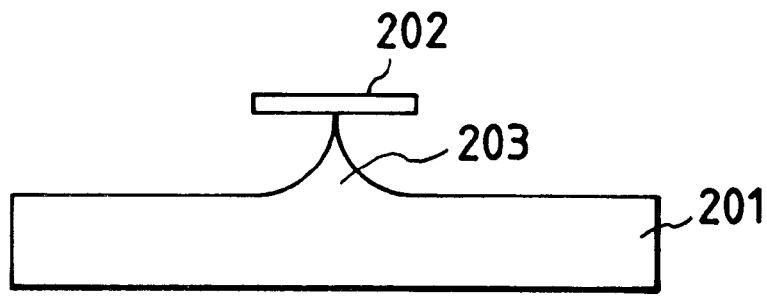
FIG. 2 is a sectional view illustrating a conventional manufacturing process of a micro-tip.
Figure 2B:
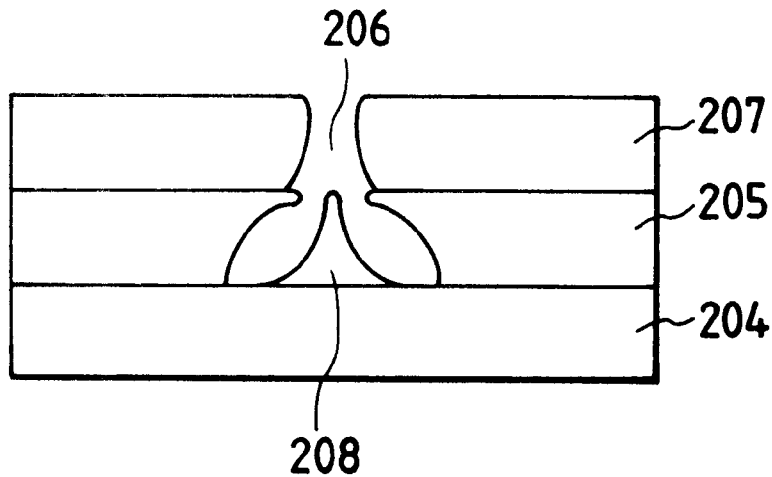
Figure 3A:
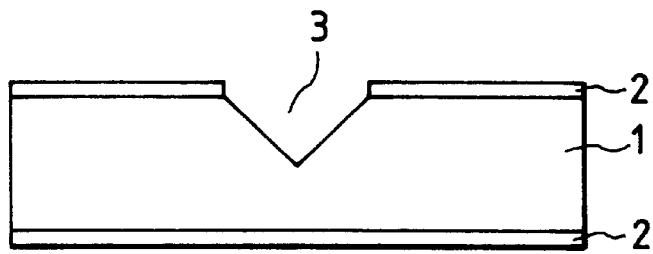
FIG. 3 illustrates a method of manufacturing a probe according to a first embodiment of the present invention.
Figure 3B:
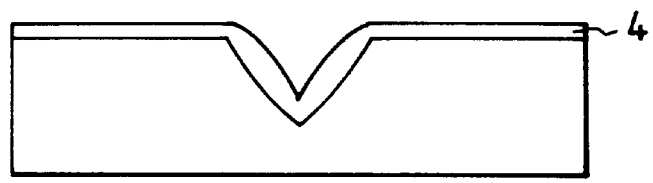
Figure 3C:
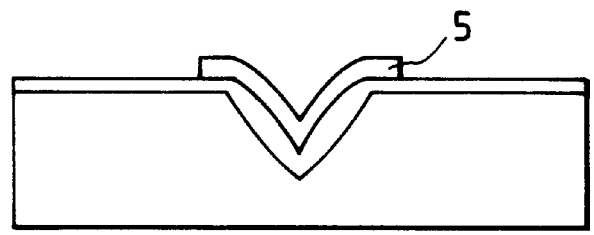
Figure 3D:
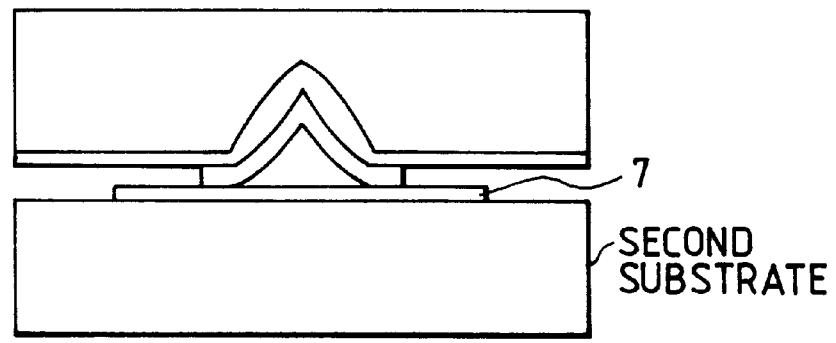
Figure 3E:
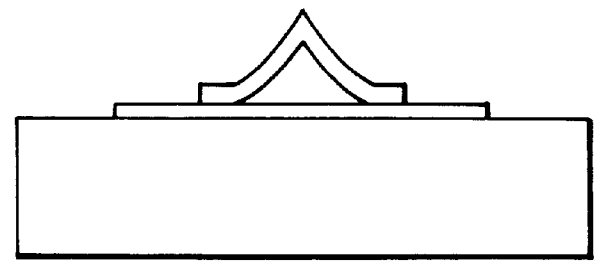

According to the present invention, which permits forming a micro-tip without removing a female mold used for the manufacture of the micro-tip by the foregoing manufacturing method in a subsequent step, it is possible to reuse the female mold, thereby improving productivity, and reducing the manufacturing cost.

It is also possible to eliminate deterioration of the material and the shape of the tip portion caused by an etchant and contamination from the etchant.

In addition, a metal can be used as a tip material, this eliminating the necessity of coating the tip with a conductive material, and only the tip can be formed into a distal end of a cantilever, thus eliminating the need for forming a reflection film on the back surface of the probe.

Furthermore, a uniform shape is available with a high reproducibility by using a micro-tip material comprising a metal, and the tip can be formed into a sharp shape. Even when forming a plurality of micro-tips, it is possible to impart uniform radii of curvature at the distal ends of all micro-tips, leading to easy achievement of a multi-tip.

Now, the present invention will be described below in detail with reference to the drawings.

The probe of the present invention is a probe for detecting tunneling current or micro-force, which comprises a joining layer formed on a substrate or a lever, a tip formed on this joining layer, and a hollow space surrounded by the joining layer and the tip. FIG. 3 is a sectional view illustrating the manufacturing steps thereof.

The manufacturing method will be described below with reference to FIG. 3.

First, a recess 3 is formed on the surface of a first substrate 1 comprising silicon. This is accomplished by a method comprising first forming a protective layer 2 on the first substrate 1, then patterning a desired portion of the protective layer 2 by photolithography and etching to expose a portion of silicon, and then etching silicon by the use of crystal axis anisotropic etching or the like, thereby forming the recess 3.

Silicon dioxide or silicon nitride may be used for the protective layer 2. Silicon should preferably be etched by crystal axis anisotropic etching which permits forming of the distal end portion of the tip into a sharp shape.

By using an aqueous solution of potassium hydroxide as the etchant, it is possible to form a reversed pyramid-shaped recess 3 surrounded by four planes equivalent to (111) planes (refer to (a) in FIG. 3).

Secondly, a peeling layer 4 comprising an oxide is formed on the first substrate 1 including the above-mentioned recess 3.

In the step after forming this peeling layer 4, a film of the micro-tip 5 material is formed on the peeling layer 4, and then the micro-tip 5 is peeled off the peeling layer 4. It is therefore necessary to select a material for the peeling layer 4, from which the micro-tip 5 material can easily be stripped off.

Satisfactory peeling is possible by using, as the material for the peeling layer 4, a nitride or oxide, of a metal element, a semi-metal element, or a semiconductor element, which is low in reactivity and adherence with the tip 5 material. Particularly when it is necessary to form simultaneously a plurality of tips, the result largely depends upon the material of the peeling layer, and a plurality of tips are available at a high yield by using such an oxide or nitride. Applicable oxides and nitrides include, for example, BN, AlN, $Al_2O_3$, $Si_3N_4$, $SiO_2$, TiN, $TiO_2$, $VO_2$, $Cr_2O_3$, $ZrO_2$, $Ta_2O_5$ and $WO_3$. These materials can be formed by the sputtering method or the vacuum vapor depositing method.

Furthermore, when silicon is used for the first substrate 1, silicon dioxide ($SiO_2$) is easily available by oxidizing the substrate surface. Formation of silicon dioxide by oxidation may be accomplished by any of a method of holding in the air (spontaneous oxidation), a method of utilizing sulfuric acid with hydrogen peroxide water, a method of using boiling, water, and a method of employing a thermal oxidizing furnace. Particularly, the method of thermally oxidizing the silicon surface by the use of the thermal oxidizing furnace is excellent in reproducibility, controllability and film forming speed.

When using this method for the peeling layer, in particular, it is possible to absorb irregularities of the surface of the silicon substrate and achieve a smooth surface by making a thick thermally oxidized film. This results in a smooth surface of the formed tip, and strength of the formed tip can be improved. Because the tip and the peeling layer is smooth, it is easier to strip off the tip from the peeling layer. In order to obtain the foregoing effects, the film thickness of silicon dioxide should preferably be at least 200 nm.

By forming an oxide film through thermal oxidation of silicon, the side wall surface forming the tip can be formed convex toward the hollow space (refer to (b) in FIG. 3). This utilizes the fact that a difference in thickness of silicon dioxide occurs upon thermal oxidation between different shapes of silicon. This permits achievement of a strong structure of the tip.

More specifically, since the tip has a hollow structure, a metal tip tends particularly to be deformed upon contact of the tip distal end with the sample. By using the shape as shown in FIG. 3, it is possible to realize a structure hard to deform by a force acting on the tip distal end portion.

In order to obtain the foregoing effect, the film thickness of silicon dioxide should preferably be at least 500 nm. It is also possible to reduce the radius of curvature at the distal end.

Thirdly, a micro-tip 5 is formed on the peeling layer containing the above-mentioned recess. The material for the micro-tip 5 should preferably be a metallic material having a high conductivity, or more preferably, a precious metal or an alloy of a precious metal.

Any of the vacuum vapor depositing method, the sputtering method and the like, which are known thin film manufacturing techniques, is applied for forming the material for the micro-tip 5 into a film.

The vacuum vapor depositing method provides a particularly excellent peeling property with a low adherence with the peeling layer 4 because of the low energy of grains upon film formation.

Particularly, the vacuum vapor depositing method provides a low adherence with the peeling layer 4 because of a low energy of grains upon film formation, and an excellent peeling property. After film formation, the micro-tip 5 material is patterned by using the known photolithography (refer to (c) in FIG. 3).

The micro-tip may also be formed by the plating method. More particularly, it is possible to easily reduce the material cost without wasting the metal material and to form the micro-tip by forming an electrode layer for plating by a known film forming technique on the first substrate, covering the portion of this electrode layer for plating other than the micro-tip with a resist or the like, and then, forming the micro-tip material selectively onto the exposed portion of the plating electrode (micro-tip forming portion) by the plating method. Plating may be accomplished with or without electrolysis. Because non-electrolytic plating poses problems of pH of the solution, a high liquid temperature and a large film stress, the electrolytic plating should preferably be used.

Fourthly, a joining layer 7 is formed on a second substrate 8 or an elastic member such as a cantilever formed on the second substrate 8. The second substrate 8 and the elastic member 9 are members supporting the micro-tip 5 via the joining layer 7.

The joining layer 7 is for pressure bonding the tip. By using metals for the micro-tip 5 and the joining layer 7, a metal bonding can be achieved through mutual deformation under pressure.

It is therefore desirable to use a metal rich in ductility and malleability such as Au and Pt. When using silicon dioxide, particularly silicon dioxide formed by thermal oxidation for the peeling layer, Au or Pt gives a tip excellent in peeling property and yield.

A wiring 10 for taking out tunneling current may be formed with the same material on the same layer as the joining layer 7.

Fifthly, bonding the micro-tip 5 on the peeling layer 4 containing the above-mentioned recess 3 to the peeling layer 7. This is done by using an alignment apparatus capable of holding the two substrates with a vacuum chuck or the like, aligning, arranging at mutually opposite positions, and bringing into contact the micro-tip 5 on the first substrate 1 and the joining layer 7 on the second substrate 8, and applying a load on them, thereby (pressure-) bonding the micro-tip 5 and the joining layer 7 (refer to FIG. 3(d)).

Sixthly, peeling is carried out on the interface between the above-mentioned peeling layer 4 and the micro-tip 5 to transfer the micro-tip 5 onto the joining layer 7. More specifically, the peeling layer 4 and the micro-tip 5 are peeled off each other at the interface by separating the first substrate 1 from the second substrate 8 (refer to FIG. 3(e)).

More specifically, it is now possible to prepare a probe for detecting tunneling current or micro-force, having the micro-tip at the free end thereof by forming bonding layers comprising resin films serving as at least one fixed electrode on the second substrate and/or the third substrate, bonding the third substrate to the second substrate via the bonding layer, shaping the third substrate into a flat thin film, forming a support portion for connecting the flat thin film and the second substrate, and a bonding layer, and after bonding and transferring the micro-tip material on the peeling layer of the first substrate to the bonding layer, removing the joining layer. The foregoing probe has a construction comprising a flat thin film, two twist beams rotatably supporting the flat thin film relative to the above-mentioned substrate, a supporting unit which arranges the flat thin film in parallel with the substrate by supporting the twist beam from above on the substrate via a gap, a joining layer formed at an end of the flat thin film, and a micro-tip formed on the joining layer. The probe has therefore functions of an electrostatic actuator in which electrostatic force produced by the application of voltage onto a fixed electrode formed on a second substrate under the flat thin film and onto the flat thin film causes the twist beam to make a twisting rotation, thus causing the flat thin film to rotate and displace.

Now, the present invention will be described below further in detail by means of examples.

EXAMPLE 1

FIG. 4 illustrates the configuration of a probe for STM in a first embodiment of the present invention. In FIG. 4, a micro-tip 5 is bonded onto a joining layer 7 formed on the substrate, and a tunneling current wiring 10 is connected to the joining layer 7.

FIG. 3 is a sectional view illustrating a manufacturing process of the probe of the first embodiment. The manufacturing method will be described below with reference to FIG. 3.

First, monocrystal silicon having a plane orientation (100) was provided as the first substrate 1. Then, a silicon thermally oxidized film having a thickness of 100 nm was formed as the protective layer 2. Thereafter, desired portions of the protective layer 2 were patterned by photolithography and etching to expose an area of 10 $\mu m^2$ of silicon.

Then, silicon at the patterned portion was etched by crystal axis anisotropic etching using an aqueous solution of potassium hydroxide.

The etching conditions included an aqueous solution of potassium hydroxide having a concentration of 30%, a solution temperature of 90° C. and an etching time of 10 minutes. A reversed pyramid-shaped recess 3 having a depth of about 7 $\mu m$ surrounded by four planes equivalent to the (111) planes was formed (refer to (a) in FIG. 3).

Then, the thermally oxidized film serving as the protective layer 2 was removed by means of a mixed aqueous solution of fluoric acid and ammonium fluoride ($HF:NH_4F=$ 1:5). Subsequently, the first substrate 1 was rinsed with a mixed solution of sulfuric acid and hydrogen peroxide water heated to 120° C. and a 2% aqueous solution of fluoric acid. Thereafter, the first substrate was heated to 1,000° C. in an oxygen and hydrogen atmosphere in a oxidizing furnace, to deposit silicon dioxide serving as the peeling layer 4 into a thickness of 100 nm (refer to (b) in FIG. 3). Then, Au as a micro-tip 5 material was formed into a film which was patterned by photolithography and etching. The Au film had a thickness of 1.0 $\mu m$ (refer to (c) in FIG. 3).

Then, a silicon substrate having a surface oxide film formed thereon was provided as a second substrate 8. Chromium (Cr) was deposited into a thickness of 5 nm and Au was deposited into a thickness of 300 nm on this surface by the vacuum vapor depositing method, and the formed film was patterned by photolithography and etching to form a joining layer 7 and a wiring 10. Subsequently, the micro-tip 5 on the first substrate 1 and the joining layer 7 on the second substrate 8 were aligned, arranged at mutually opposite positions, brought into contact with each other, and subjected to a load to (pressure-) bond the micro-tip 5 and the joining layer 7 (refer to (d) in FIG. 3).

Then, the peeling layer 4 and the micro-tip 5 were peeled off from each other at the interface thereof by separating the first substrate 1 and the second substrate 8 (refer to (e) in FIG. 3). At this point, the tip had a height of about 8 $\mu m$ from the substrate surface, and the tip distal end has a radius of curvature of about 30 nm.

FIG. 5 is a block diagram of an STM apparatus to which the micro-tip of this example is applied. In FIG. 5, bias voltage is applied between the micro-tip 5 and the sample 11 to detect tunneling current It flowing between the micro-tip 5 and the sample 11. Feedback is applied so as to give a constant It, and the Z-direction of the XYZ driving piezo element 12 is driven to keep a constant distance between the tip 5 and the sample 11.

Furthermore, an STM image which is a two-dimensional image of the sample is observed by driving XY of the XYZ drive piezo element 12. Observation of the cleavage plane of an HOPG (high orientation pyrolysis graphite) substrate as the sample in this apparatus by means of bias current 1 nA gave a satisfactory atomic image.

In the example, a plurality of micro-tips 5 could be formed on the second substrate 8 by forming a plurality of recesses 3 on the first substrate 1 in the same manner as in Example 1. This method permitted simultaneous formation of uniform-shaped micro-tips at a high yield.

Tip pressure-bonding probabilities were compared under the following two conditions for the three cases including a case where the Si surface of the first substrate was used as a peeling layer without forming $SiO_2$ into a film in the process (b) in FIG. 3, a case where Cr was formed into a film having a thickness of 100 nm by the vacuum vapor depositing method on the first substrate 1 as a peeling layer 4 in the process (b) in FIG. 3, and a case where the method of the Example was used. The micro-tip 5 was an Au film having a thickness of 1.0 μm.

Condition 1: As in the present Example, an Au-coated film with a Cr primer was used as a joining layer 7, with a pressure-bonding load of 10 kgf and a bonding temperature of the room temperature.

Condition 2: The joining layer 7 comprised Al, and the sample was held for an hour at a temperature of 300° C. in a nitrogen atmosphere under a pressure-bonding load of 10 kgf. The pressure-bonding probabilities for 1,000 micro-tips 5 on the first substrate 1 are shown in the following table.

| Peeling layer | Si | Cr | $SiO_2$ |
| --- | --- | --- | --- |
| Pressure-bonding probability: | | | |
| Condition 1 | 25% | 85% | 100% |
| Condition 2 | 10% | 70% | 100% |

As is clear from these results, use of $SiO_2$ as the peeling layer 4 facilitated peeling, and improved the yield of junction.

EXAMPLE 2

In Example 2 of the present invention, the probe for STM or the manufacturing method thereof was different from those in Example 1.

The probe had the same construction as in Example 1, with substantially the same manufacturing process of the probe.

The points different from those in Example 1 are as follows:

In the process represented by (b) in FIG. 3, silicon dioxide serving as the peeling layer 4 was deposited into a thickness of 500 nm. The distal end portion of the tip prepared by the method had a radius of curvature of about 20 nm. The cleavage plane of an HOPG (high orientation pyrolysis graphite) substrate was observed with a bias current of 1 nA in the same manner as in Example 1 in an STM apparatus shown in FIG. 5 with the use of a probe for STM prepared in the Example. A finer atomic image than that in Example 1 was obtained.

EXAMPLE 3

Example 3 of the present invention composes a cantilever-type probe for AFM and a method of manufacturing the same. The probe construction is shown in FIG. 7.

Figure 7A:
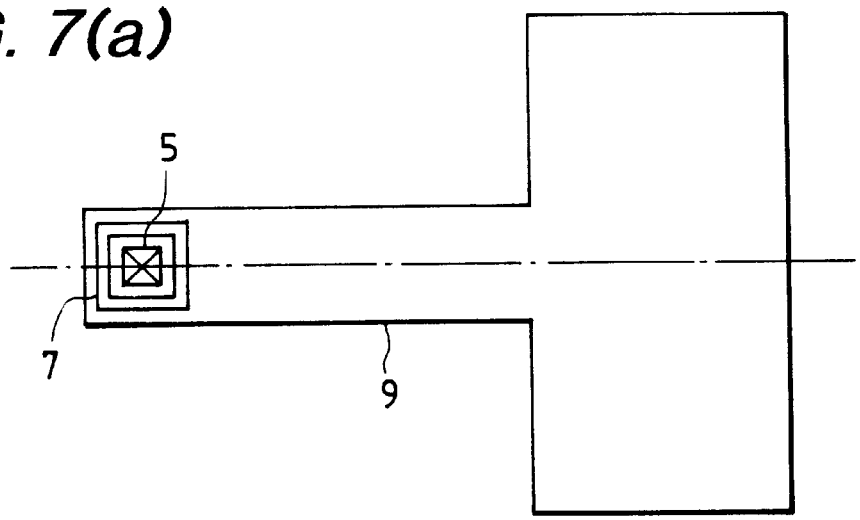
FIG. 7 illustrates the probe according to the second embodiment of the present invention.
Figure 7B:
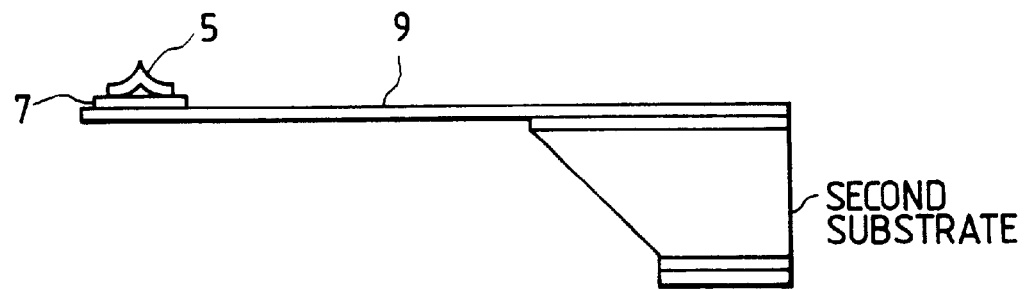

In FIG. 7, a micro-tip 5 is bonded onto a joining layer 7 formed on a cantilever 9.

FIG. 6 is a sectional view illustrating the manufacturing process of a probe of this Example.

The manufacturing method will be described below with reference to FIG. 6.

First, a monocrystal silicon wafer having a plane orientation (100) was provided as a first substrate 1.

Then, a silicon thermally oxidized film having a thickness of 100 nm was formed as a protective layer 2.

Subsequently, a desired portion of the protective layer 2 was patterned by photolithography and etching to expose silicon by an area of 10 $μm^2$.

Thereafter, silicon in the patterned portion was etched by crystal axis anisotropic etching using an aqueous solution of potassium hydroxide.

The etching conditions included an aqueous solution of potassium hydroxide having a concentration of 30%, a liquid temperature of 90° C. and an etching time of 10 minutes.

There was at this point formed a reversed pyramid-shaped recess 3 having a depth of about 7 μm surrounded by four planes equivalent to planes (111) (refer to (a) in FIG. 6).

Then, the thermally oxidized film serving as the protective layer 2 was removed by means of a mixed aqueous solution of fluoric acid and ammonium fluoride ($HF:NH_4F=$ 1:5).

Subsequently, the first substrate 1 was rinsed with a mixed solution of sulfuric acid and hydrogen peroxide water heated to 120° C. and a 2% aqueous fluoric acid solution.

Thereafter, the first substrate 1 was heated to 1,000° C. in an atmosphere comprising oxygen and hydrogen in a thermal oxidizing furnace to deposit silicon dioxide serving as a peeling layer 4 into a thickness of 500 nm (refer to (b) in FIG. 6).

Then, Au as a micro-tip 5 material was formed into a film by the vacuum vapor depositing method, and patterned by photolithography and etching.

The Au film had a thickness of 1.0 μm (refer to (c) in FIG. 6).

Then, a monocrystal silicon substrate was provided as a second substrate 8, and silicon dioxide 13 into a thickness of 0.3 μm and silicon nitride 14 into a thickness of 0.5 μm were formed into films on the both surfaces of the second substrate 8. Thereafter, silicon nitride 14 on the surface were patterned by photolithography and etching into a cantilever 9 shape.

At this point, the cantilever had a width of 50 μm and a length of 300 μm. Then, silicon nitride 14 and silicon dioxide 13 on the back were similarly patterned in an etching mask shape.

Subsequently, titanium (Ti) and gold (Au) were formed into films of thickness of 3 nm and 50 nm, respectively, and patterned by photolithography and etching, to form a joining layer 7 on the cantilever.

Thereafter, the micro-tip 5 on the first substrate 1 and the joining layer 7 on the second substrate 8 were aligned, arranged opposite to each other, and brought into contact with each other, and the micro-tip 5 and the joining layer 7 were (pressure-) bonded by applying a load (refer to (d) in FIG. 6).

Then, the peeling layer 4 and the micro-tip 5 were peeled off at the interface by separating the first substrate 1 from the second substrate 8 (refer to (e) in FIG. 6).

Then, a polyimide layer was coated by spin coating onto the surface protective layer 15, and formed by baking.

Thereafter, the silicon substrate 8 was etched from the back with an aqueous solution of 30% potassium hydroxide heated to 90° C. with silicon nitride on the back as the etching mask. Then, the silicon dioxide layer 13 was removed by means of a mixed aqueous solution of fluoric acid and ammonium fluoride.

Finally, the surface protective layer was removed by means of oxygen plasma to form a cantilever-type probe (refer to (f) in FIG. 6).

An optical-lever type AFM apparatus was manufactured using a probe of this Example as described above. The probe for AFM prepared in this Example makes it possible to reflect a laser for measurement of displacement on the back surface of the joining layer 7 provided at the distal end of the cantilever for substitution of a reflection film.

This eliminated the necessity of coating the entire back surface of the cantilever with a reflection film, and make it free from a warp caused by film stress.

Figure 8:
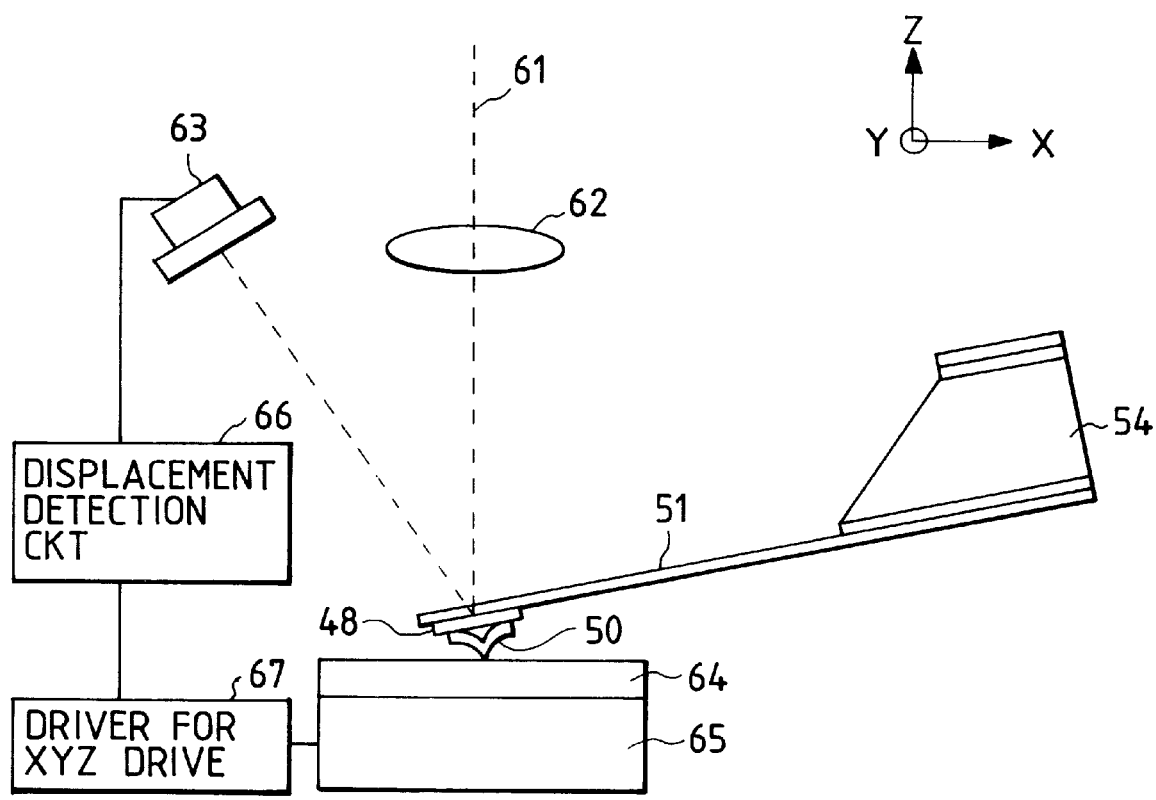
FIG. 8 is a block diagram of an AFM apparatus using the probe according to the second embodiment of the present invention.
Figure 9A:
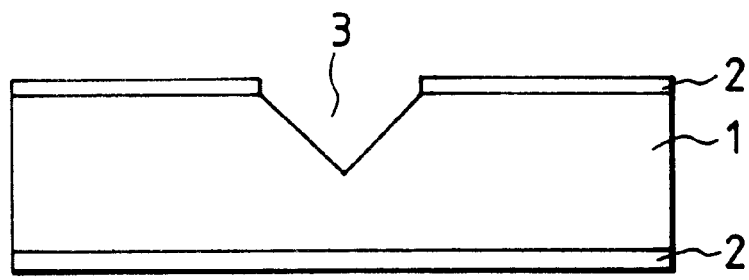
FIG. 9 illustrates a method of manufacturing a probe according to a third embodiment of the present invention.
Figure 9B:
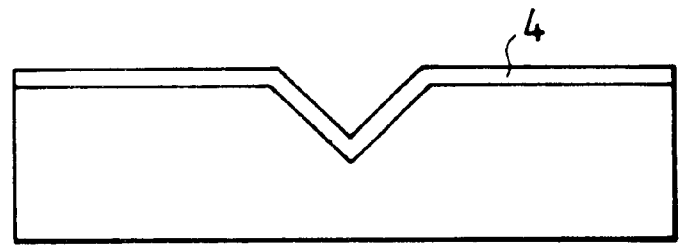
Figure 9C:
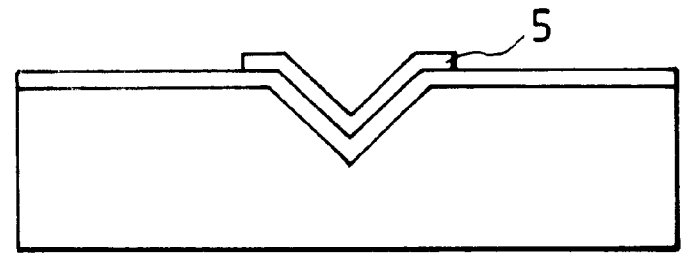
Figure 9D:
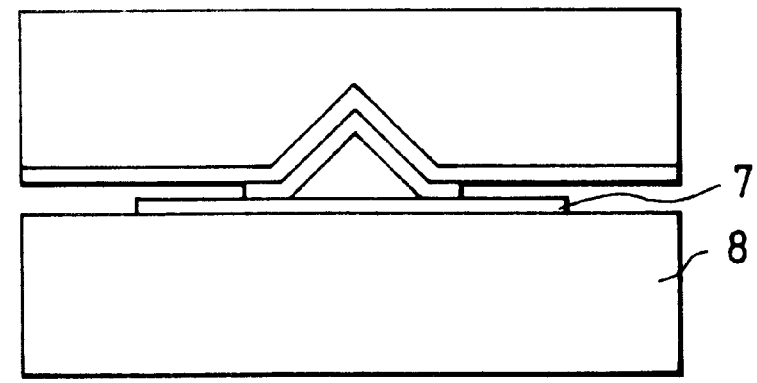
Figure 9E:
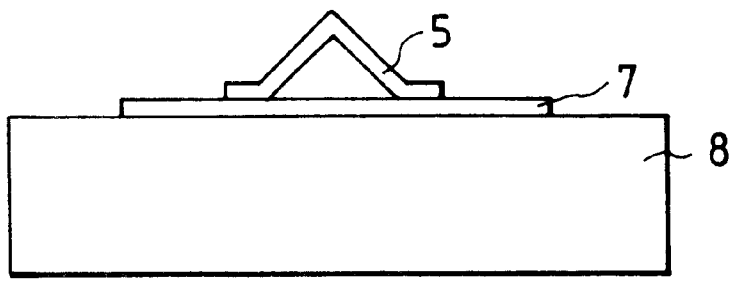

A block diagram of this AFM apparatus is illustrated in FIG. 8.

The AFM apparatus comprises a probe comprising a cantilever 51, a joining layer 48, and a micro-tip 50 bonded with the joining layer 48, a laser beam 61, a lens 62 for concentrating the laser beam onto the back of the joining layer at the free end of the cantilever, a position sensor 63 which detects a change in reflection angle of the beam caused by a deflection displacement of the cantilever, a displacement detecting circuit 66 which detects a displacement by means of a signal from the position sensor, an XYZ-axis drive piezo element 65, and an XYZ driver 67 for driving the XYZ-axis drive piezo element in XYZ-directions.

An AFM image on the sample surface was observed by using this AFM apparatus, bringing the probe closer to a sample 64 comprising mica, and then driving the XY-directions of the XYZ-axis drive piezo element 65. A step image on the mica surface could be observed.

In this Example, a micro-tip 5 could be formed on each of a plurality of the cantilevers 9 by forming a plurality of recesses 3 on the first substrate 1 in the same manner as in Example 3 and forming a plurality of cantilevers 9 on the second substrate 8. In this manner, it was possible to simultaneously from uniform-shaped micro-tips at a high yield.

EXAMPLE 4

Example 4 of the present invention presents another method of manufacturing a micro-tip: a process diagram is illustrated in FIG. 9.

First, a monocrystal silicon wafer of a plane orientation (100) was provided as a first substrate 1, and a reversed pyramid-shaped recess 3 was formed in the same manner as in Example 1 (refer to (a) in FIG. 9).

Then, aluminum oxide ($Al_2O_3$) was deposited into a thickness of 100 nm as a peeling layer 4 on the first substrate 1 containing the recess 3 by the sputtering method (refer to (b) in FIG. 9).

Subsequently, platinum (Pt) was formed into a film as the micro-tip 5 material by the electron beam (EB) vapor depositing method, and patterned by photolithography and etching. At this point, the Pt film had a thickness of 1.0 $\mu$m (refer to (c) in FIG. 9).

Thereafter, a silicon substrate having a surface oxide film formed thereon was provided as the second substrate 8. Chromium (Cr) and gold (Au) were formed into films having thickness of 5 nm and 300 nm, respectively, by the vacuum vapor depositing method on the surface of the second substrate 8, and patterned by photolithography and etching to form a joining layer 7 and a wiring 10. Then, the micro-tip on the first substrate 1 and the joining layer on the second substrate 8 were aligned, arranged opposite to each other, and brought into contact with each other. By applying a load, the micro-tip 5 and the joining layer 7 were (pressure-) bonded together (refer to (d) in FIG. 9).

Then, the peeling layer 4 and the micro-tip 5 were peeled off at the interface by separating the first substrate 1 from the second substrate 8 (refer to (e) in FIG. 9). At this point, the tip had a height of about 8 $\mu$m from the substrate surface.

In an STM apparatus using this Example, the cleavage plane of an HOPG (high orientation pyrolysis graphite) substrate was observed with a bias current of 1 nA in the same manner as in Example 1, and a satisfactory atomic image could be obtained.

While aluminum oxide ($Al_2O_3$) was used as the peeling layer 4 in this Example, the same effect is available also by depositing chromium oxide ($Cr_2O_3$) by sputtering.

EXAMPLE 5

Example 5 of the present invention presents still another method of manufacturing a micro-tip.

This Example will be described below also with reference to FIG. 9 used for the description of Example 4.

First, a monocrystal silicon wafer of a plane orientation (111) was provided as a first substrate 1, and a reversed pyramid-shaped recess 3 was formed in the same manner as in Examples 1 and 3 (refer to (a) in FIG. 9).

Then, silicon nitride ($Si_3N_4$) was deposited into a thickness of 100 nm as a peeling layer 4 on the first substrate 1 containing the recess 3 by the application of the low-pressure chemical vapor depositing (LP-CVD) method (refer to (b) in FIG. 9).

Subsequently, platinum (Pt) was formed into a film as a micro-tip 5 material by the electron beam (EB) vapor depositing method, and patterned by photolithography and etching. At this point, the Pt film had a thickness of 1.0 $\mu$m (refer to (c) in FIG. 9).

Thereafter, a silicon substrate having a surface oxide film formed thereon was provided as a second substrate 8. Chromium (Cr) and gold (Au) were formed into films by the vacuum vapor depositing method on the surface of the second substrate 8 into thicknesses of 5 nm and 300 nm, respectively, and patterned by photolithography and etching to form a joining layer 7 and a wiring 10. Then, the micro-tip on the first substrate 1 and the joining layer on the second substrate 8 were aligned, arranged opposite to each other, and brought into contact with each other. By applying a load, the micro-tip 5 and the joining layer 7 were (pressure-) bonded (refer to (d) in FIG. 9).

Then, the peeling layer 4 and the micro-tip 5 were peeled off at the interface by separating the first substrate 1 from the second substrate 8 (refer to (e) in FIG. 9). At this point, the tip had a height of about 8 $\mu$m from the substrate surface.

In an STM apparatus using this Example, the cleavage plane of an HOPG (high orientation pyrolysis graphite) substrate was observed with a bias current of 1 nA as in Example 1. A satisfactory atomic image was obtained.

The tip pressure-bonding probabilities were compared among three cases including a case where the Si surface of the first substrate 1 was used as a peeling layer 4 without forming silicon nitride into a film in the process shown in (b) in FIG. 9, a case where Cr was formed into a film having a thickness of 100 nm by the vacuum vapor depositing method on the first substrate 1 as a peeling layer 4 in the process shown in (b) in FIG. 9, and a case where the method of this Example was applied. A Pt film having a thickness of 1.0 $\mu$m was used as the micro-tip 5. An Au film having a Cr primer was used as the joining layer 7, and an experiment was carried out under a pressure bonding load of 10 kgf and at a bonding temperature of the room temperature. Pressure-bonding probabilities for 1,000 micro-tips on the first substrate 1 are shown in the following table.

| Peeling layer | Si | Cr | Silicon nitride |
|---|---|---|---|
| Pressure-bonding probability | 25% | 85% | 100% |

As is clear from these result, use of silicon nitride as the peeling layer 4 facilitated peeling and improved bonding yield.

EXAMPLE 6

Example 6 of the present invention is to present a probe for AFM/STM and a method of manufacturing the same. In this Example, a probe for AFM or STM was manufactured by transferring the micro-tip on the first substrate prepared in Example 2 of the present invention onto a flat thin film comprising crystal silicon.

Figure 10A:
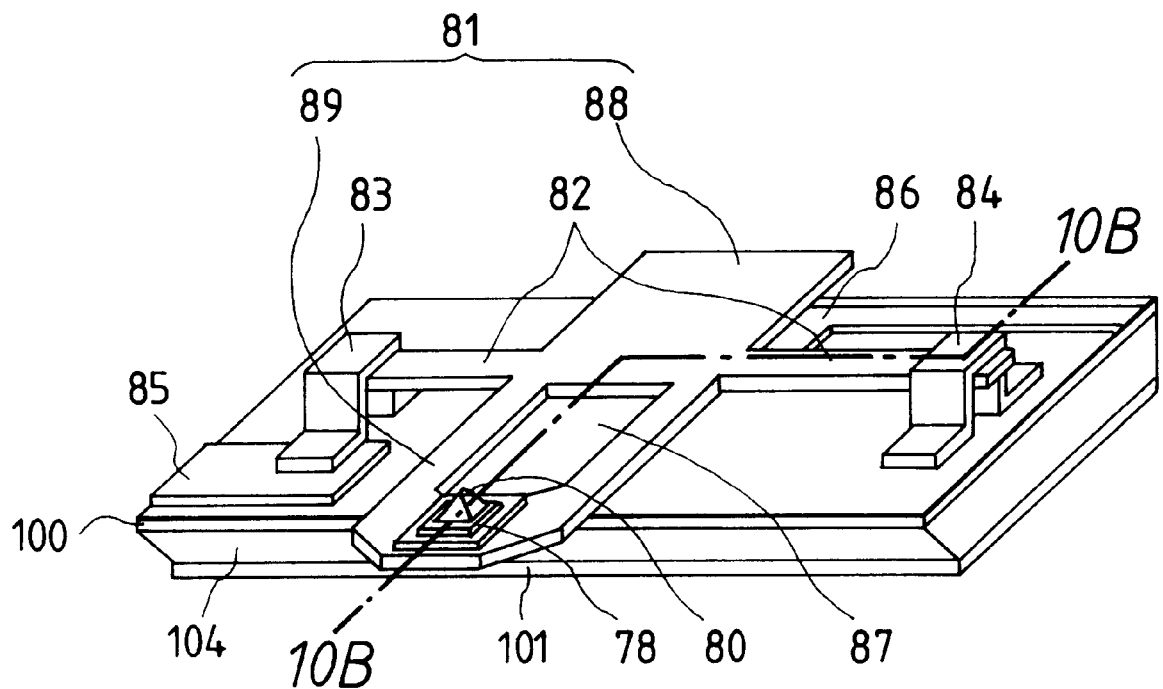
FIGS. 10A and 10B are descriptive views of a probe according to a fourth embodiment of the present invention.
Figure 10B:
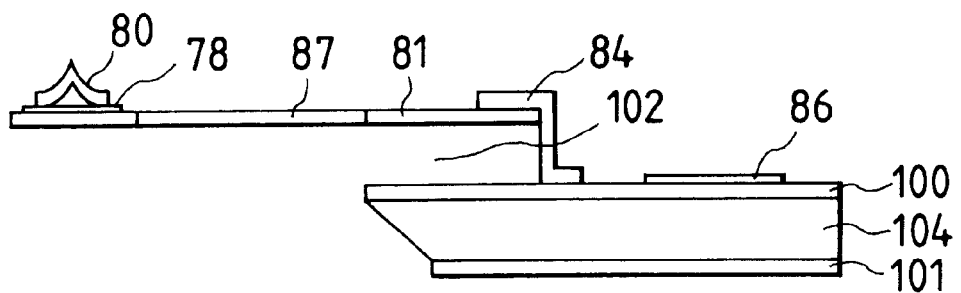
Figure 11A:
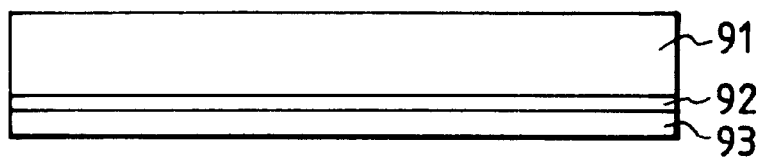
FIG. 11 is a sectional view illustrating steps of a method of manufacturing the probe according to the fourth embodiment of the present invention.
Figure 11B:
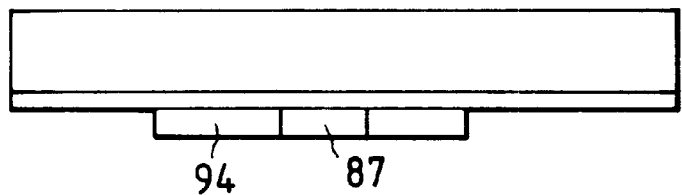
Figure 11C:
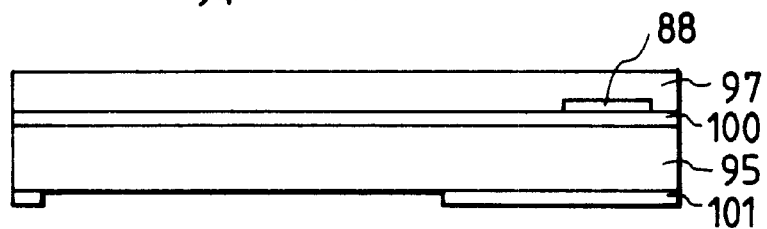
Figure 11D:
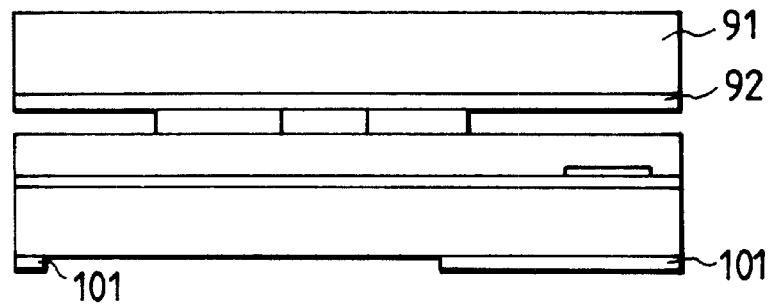
Figure 11E:
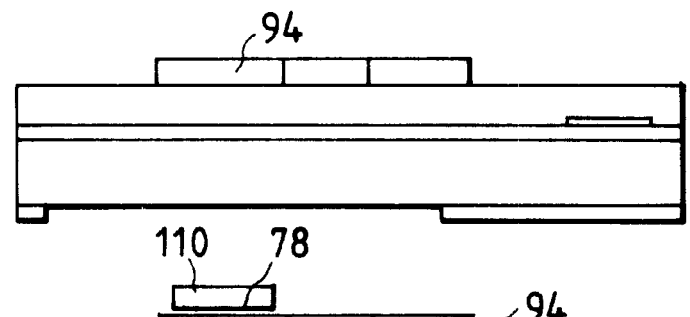
Figure 11F:
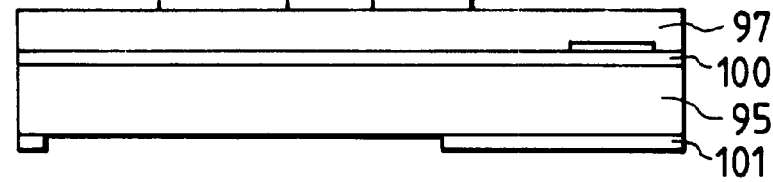
Figure 11G:
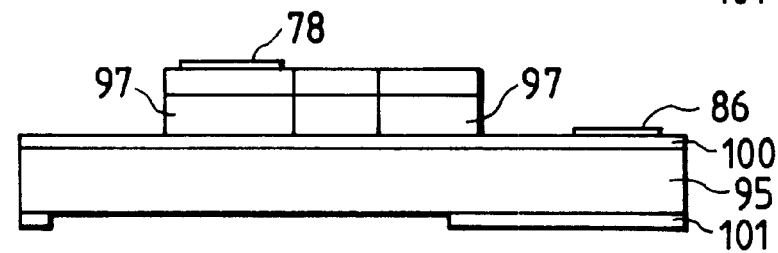
Figure 12H:
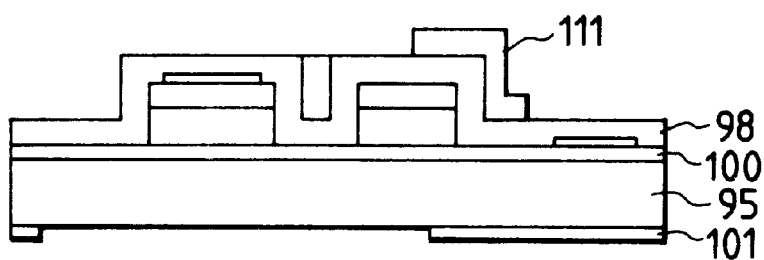
FIG. 12 is another sectional view illustrating steps of the method of manufacturing the probe according to the fourth embodiment of the present invention.
Figure 12I:
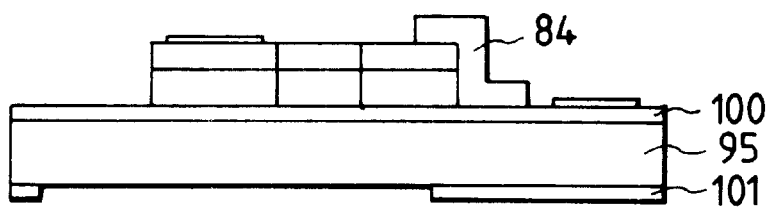
Figure 12J:
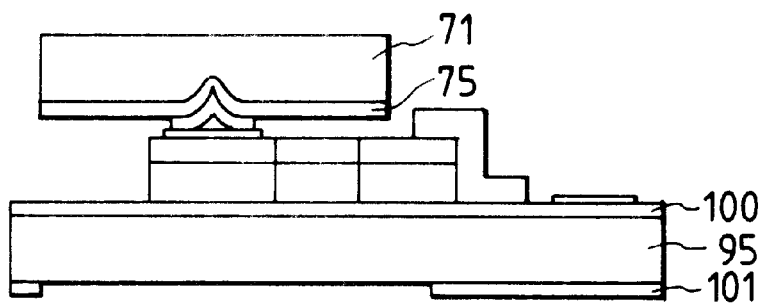
Figure 12K:
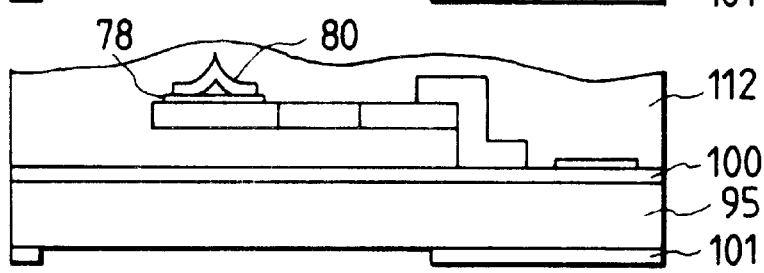
Figure 12L:
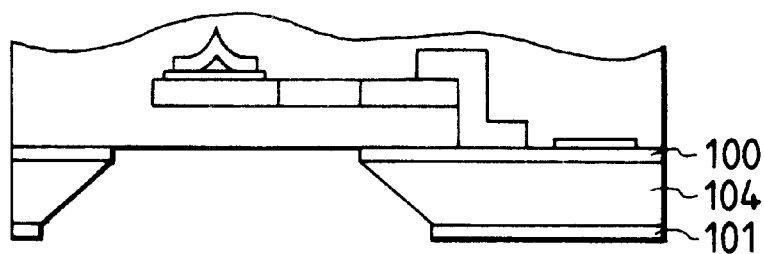
Figure 12M:
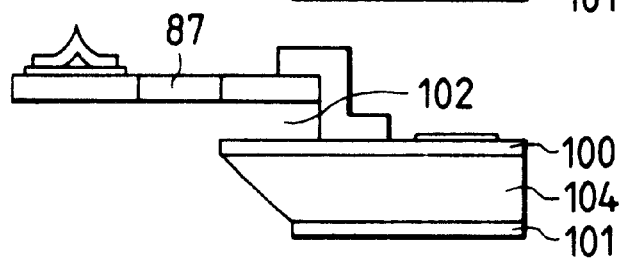

A perspective view of the prepared probe is illustrated in FIG. 10A, and a sectional view thereof cut along the line 10B—10B, in FIG. 10B. The construction of the probe of the Example will be described below with reference to FIGS. 10A and 10B.

In FIGS. 10A and 10B, 104 is a silicon block forming silicon nitride films 100 and 101 having fixed electrodes 85 and 86, and 81 is a float thin film comprising n-type crystal silicon having conductivity, which has a twist beam 82 on the side thereof and is suspension-supported at the upper surface of the twist beam 82 by supports 83 and 84 through a gap 102.

The flat thin film 81 has a flat electrode portion 88, and a flexible beam 89 provided with a joining layer 78 at an end thereof and an opening 87 having a micro-tip 80 formed on the joining layer.

The fixed electrode 86 is formed in arrangement on the silicon nitride film 100 so as to be opposite to the flat electrode portion 88.

The supports 83 and 84 comprise a conductive material taking the form of Al films. The joining layer is made of Pt, and the micro-tip comprises Au formed by the same process as in Example 1.

The support 83 is electrically connected with the micro-tip 80 via the flat thin film 81 and the fixed electrode 85, and via the flat thin film 81 and the joining layer 78.

Due to this configuration, the supports mechanically and electrically connect the flat thin film 81 via the twist beam 82, thus forming an air bridge construction.

The probe of the present invention has functions of an electrostatic actuator in which, by applying voltage onto the fixed electrodes 86 and 85, an electrostatic attraction is produced between the fixed electrode 86 and the flat electrode portion 88, this causing the twist beam to twist-rotate, the flat electrode portion to displace onto the silicon block side, and the micro-probe to displace in the reverse direction, i.e., the flat thin film 81 rotation-displaces around the rotation axis of the twist beam.

The probe having the electrostatic actuator of the present invention is applicable as a probe for AFM because it has a micro-tip at the free end of the flexible beam, and at the same time, applicable as a probe for STM because it has conductive micro-tip and flat thin film. It is furthermore applicable as a composite STM/AFM probe.

By using the probe of the present invention in the STM apparatus shown in FIG. 5, it is possible to cause the micro-tip to displace by applying voltage onto the fixed electrodes 85 and 86, and conduct driving of the XYZ-axis drive piezo element in the Z-direction in replacement.

FIGS. 11 and 12 are manufacturing process diagrams for illustrating the manufacturing method of the probe of the present invention.

The manufacturing method of the present invention as shown in the 10B—10B sectional view of the probe of FIG. 10A will now be described below with reference to FIGS. 11 and 12.

An SOI (silicon on insulator) substrate prepared by forming an n-type crystal silicon film 93 (30 Ω/□, 1 μm thick) serving as a flat thin film 81 in a subsequent process via an insulating layer 92 comprising a silicon dioxide film on a silicon substrate 91 was used as a third substrate (refer to (a) in FIG. 11).

The third substrate having a beam pattern shown in (b) in FIG. 11 was prepared by applying the photolithographic process, conducting exposure and development by applying a photoresist onto the substrate, for patterning, etching a crystal silicon 93 by reactive ion etching (RIE) with the use of $CF_4$ gas with the photoresist as a mask, forming a beam pattern 94 having an opening 87 serving later as a flat thin film in a subsequent process, and peeling off the photoresist by using a resist peeling liquid.

A silicon substrate 95 was provided as a second substrate to be bonded with a third substrate, and a silicon nitride film having a thickness of 0.5 μm serving as a mask upon crystal axis anisotropic etching the silicon substrate from the both surfaces was formed by low-pressure CVD (low-pressure chemical vapor deposition).

The film forming conditions of the silicon nitride film included a film forming temperature of 848° C., a flow rate ratio of $NH_3:SiH_2Cl_2=10$ ccm:20 ccm, and a film forming pressure of 0.2 Torr. A portion of the silicon nitride film on the back corresponding to the portion for the formation of the flat thin film 81 via a gap on the second substrate in the subsequent process was patterned as shown in (c) in FIG. 11 by photolithographic process and reactive ion etching using $CF_4$.

The fixed electrodes 85 (not shown) and 86 were formed by forming Pt target by sputtering into the film having a thickness of 100 nm. The photoresist was patterned by photolithographic process, and ion milling was applied with Ar ions using that photoresist as the mask. Photoresist was removed, and forming was accomplished by patterning as shown in FIGS. 10A and 10B.

Then, a bonding layer 97 comprising a resin film was applied onto the second substrate by the spinner method. As the resin film, rubber-based resist OMR-83 (a brand name) made by Tokyo Oka Company, which was a photoresist, was employed (refer to (c) in FIG. 11).

Unless the content of a solvent contained in a solution dissolving the resin upon application is adjusted, bubbles may remain between the bonding layer and the third substrate. By adjusting the content of solvent contained in the resin film by applying a pretreatment heating at a low temperature not causing setting, it is possible to prevent bubbles from remaining on the interface.

The bonding layer 97 was subjected to a pretreatment heating at 50° C. for 15 minutes.

The bonding layer comprising a resin layer may also be accomplished by any of the other methods of application such as the dipping method and the spraying method.

By an applying method, it is possible to ensure flatness of applied resin even in the presence of surface irregularities on the substrate, and this makes it possible to obtain satisfactory surface bonding without depending upon surface roughness or the step of the fixed electrode in the process of bonding with the third substrate.

Preferable resin materials include photoresists containing little impurities such as sodium ion when forming a resin film on the Si substrate formed by integrating circuits.

More preferable materials include the rubber-based photoresists having rubber excellent in adherence and mechanical strength (for example, "Fine Processing and Resist," by Saburo Nonogaki, ed. by Japan Polymer Society, Kyoritsu Shuppan Company, 1990, "rubber-based photoresist" on p. 11, line 3).

OMR-83 was therefore used in this Example.

After application of the bonding layer 46, the third substrate shown in (b) in FIG. 11 and the second substrate shown in (c) in FIG. 11 were pressed together by applying pressure from the back surfaces, and bonded together as shown in (d) in FIG. 11 by causing the bonding layer to set through heating to 150° C. A groove was formed on the third substrate by forming a beam pattern 94 on the crystal silicon film 93, thus permitting vapor of the organic solvent produced upon heating and setting of the bonding layer to escape through this groove, and hence preventing bubbles from remaining. After setting, the bonding layer had a thickness of 2 μm.

Thereafter, the silicon substrate 91 serving as the third substrate was removed by etching in an aqueous solution of 30 wt. % KOH at 80° C. from the bonded substrate shown in (d) in FIG. 11, and the insulating layer 92 was removed by etching in an aqueous solution of HF (refer to (e) in FIG. 11).

Then, Pt target was formed into a film having a thickness of 50 nm by sputtering, and the resist was patterned by photolithographic process. Ion million was performed by means of Ar ions with this photoresist 110 as a mask, and a joining layer 78 was formed as shown in (f) in FIG. 11. Thereafter, the photoresist 110 and a portion of the bonding layer 97 were etched as shown in (g) in FIG. 11 by reactive ion etching with the use of oxygen gas.

An Al film 98 having a thickness of 1 μm serving as a supporting layer was formed on the thus formed beam pattern and the joining layer by the ion beam sputtering method using an Al target, one of the vacuum vapor depositing methods.

The photoresist 111 was applied by the photolithographic process on the Al film 98, exposed and developed (refer to (h) in FIG. 12), and the Al film 98 was patterned by the use of an Al etchant comprising phosphoric acid, nitric acid, and acetic acid, thereby forming the patterns of the supports 83 and 84 as shown in FIGS. 10A and 10B on the twist beam 82.

The photoresist 111 was removed by reactive ion etching using oxygen gas (refer to (i) in FIG. 12).

The steps of forming the first substrate 71 are the same as those of forming the tip material layer in Example 1 as shown in (a) to (c) in FIG. 3, and the substrate 71 comprises a tip material layer 77 formed by Au serving as the micro-tip material into a film having a thickness of 1 μm on the adherence layer 76 and the peeling layer 75. The tip material layer 77 of the first substrate 71 and the joining layer 78 are aligned and bonded together (refer to (j) in FIG. 12).

Bonding was accomplished by a method consisting of pressure-bonding by applying pressure onto the back surfaces of the first and second substrates. This accomplished connection of Au and Pt, so that the tip material layer 77 and the joining layer 78 are bonded, and only Au on the peeling layer is transferred onto the joining layer 78 to form a micro-tip 80 by separating the first substrate from the second substrate after contact.

Then, the photoresist 112 was applied onto the second substrate (refer to (k) in FIG. 12), and a portion of the silicon substrate 95 was etched from the back side of the second substrate by crystal axis anisotropic etching using an aqueous solution of potassium hydroxide to form a silicon block 104. The silicon nitride film 100 in the lower part of the flat thin film was removed by reactive ion etching from the back side (refer to (l) in FIG. 12).

Finally, the photoresist 111 and the bonding layer 97 comprising a resin film in the lower part of the flat thin film were ashed with oxygen plasma to form a gap 102.

By the use of the foregoing forming method, a probe having functions of an electrostatic actuator as shown in FIGS. 10A and 10B, supported by Al supports 83 and 84, comprising a gap 102 shown in (m) in FIG. 12, a twist beam 82 comprising crystal silicon, a flat thin film 81, and a micro-tip 80 formed on the joining layer was formed. Ashing by oxygen plasma never etches the electrodes, and sticking posing problems upon removing a sacrificial layer by conventional wet etching could be avoided.

In the forming method of the present invention, it was possible to prepare a probe free from a warp, not having substantially an internal stress by preparing a flat thin film from crystal silicon.

By applying voltage between the fixed electrodes 85 and 86, the free end of the flat electrode portion displaced in the direction of the silicon block and the free end of the flexible beam displaced in response to the twisting rotation of the twist beam in the reverse direction to that of the free end of the flat electrode portion.

With the probe prepared by the manufacturing method of the present invention, reflection of a laser for measuring the AFM displacement can be accomplished on the back surface of the joining layer provided at the distal end of the flexible beam in replacement of a reflection film.

This eliminated the necessity of forming a reflection film on the entire back surface of the flexible beam, and prevented the occurrence of a warp of the flat thin film caused by film stress of the reflection film.

While, in this Example, the bonding layer was formed on the second substrate and bonded with the third substrate, a similar probe could be formed also by bonding after forming the layer on the third substrate or on the both surfaces of the second and third substrates.

EXAMPLE 7

Example 7 covers a multi-probe achieved by forming a plurality of probes having the functions of an electrostatic actuator of the present invention shown in Example 6 on a single substrate.

FIG. 11 is a descriptive view illustrating a multi-probe achieved by forming a plurality of probes shown in FIGS. 10A and 10B on a silicon block 154 having silicon nitride films 150 and 151 formed thereon.

Figure 13:
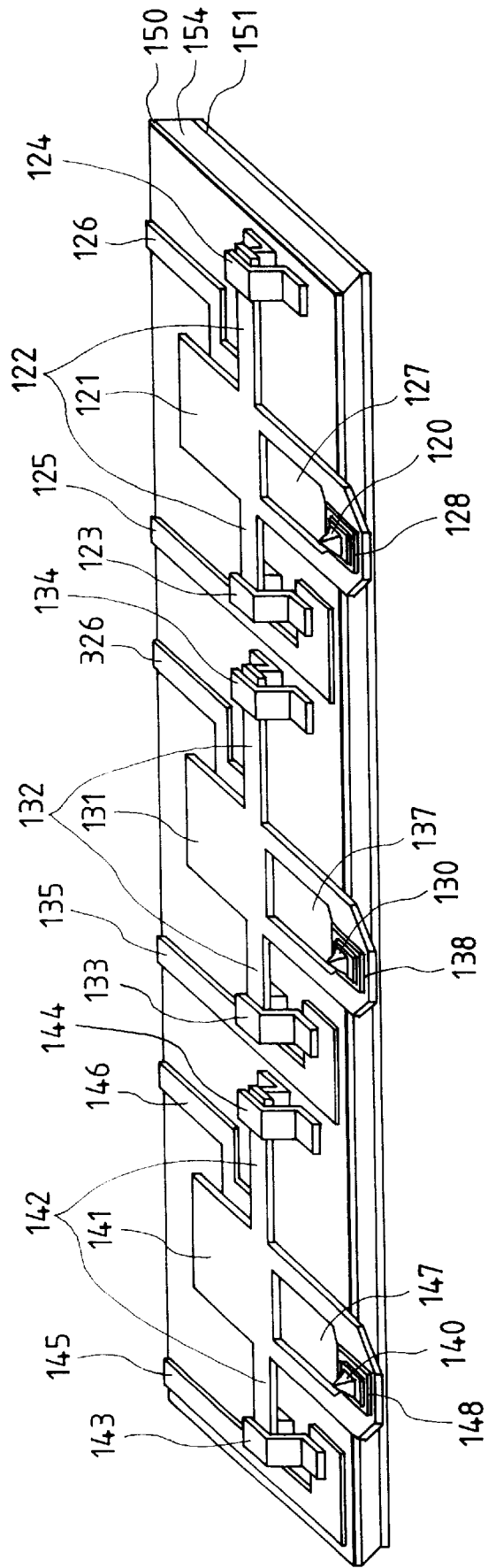
FIG. 13 is a perspective view illustrating a multi-probe shown in a fifth embodiment of the present invention.

The multi-probe of the present invention has a construction as shown in FIG. 13 described below. In FIG. 13, 121, 131 and 141 are flat thin films having twist beams 122, 132 and 142 on the sides thereof, respectively, and are suspension-supported sat the upper surfaces of the twist beams by supports 123 and 124, 133 and 134, and 143 and 144, respectively.

The flat thin films 121, 131 and 141 have joining layers 128, 138 and 148, and micro-tips 120, 130 and 140, respectively.

The individual probes have pairs of fixed electrodes 125 and 126, 135 and 136, and 145 and 146, and by applying voltage to the pairs of fixed electrodes, it is possible to cause them to rotation-displace around the rotation axes of the respective twist beams, and cause the individual probes to displace independently.

By preparing the flat thin film from crystal silicon, it is possible to achieve a probe free from warp, not having substantially an internal stress. By using uniform-shaped micro-tips formed by the method of manufacturing a micro-tip of the present invention, it became possible to inhibit fluctuations of heights of silicon blocks and micro-tips and those of the radii of curvature of distal ends of the plurality of micro-tips, resulting from warps of the cantilever and non-uniformity of the height of micro-tips, a problem encountered upon achieving a multi-probe, and thus to provide a multi-probe having a high operational reproducibility.

EXAMPLE 8

FIG. 14 is a sectional view illustrating the steps of the manufacturing method of a micro-tip in Example 8 of the present invention.

In (a) in FIG. 14, there was provided a first substrate 21 comprising a silicon wafer having a crystal plane orientation <100>, having a protective layer 22 comprising a silicon dioxide film formed through thermal oxidation by means of an oxidizing gas.

With a photoresist formed by the photolithographic process as a mask, a desired portion of the protective layer 22 was etched by an aqueous HF solution to expose an area of 8 $\mu m^2$ of silicon. The protective layer 22 was to serve upon forming a recess to act as a female mold for a micro-tip, formed by crystal axis anisotropic etching of the first substrate 21, and has an etching resistance against a crystal axis anisotropic etchant.

After peeling the photoresist, the first substrate 21 was crystal axis anisotropically etched at 80° C. with an aqueous solution of potassium hydroxide (KOH) having a concentration of 27%, thus forming a reversed pyramid-shaped recess 23 comprising crystal planes (111) with a depth of 5.6 $\mu m$.

Then, after removing the protective layer 22 by etching with an aqueous HF solution, the first substrate 21 was thermally oxidized with an oxidizing gas, thus forming a silicon dioxide film (peeling layer) 24 having a thickness of 100 nm on the first substrate containing the recess 23 (refer to (b) in FIG. 14).

Subsequently, as shown in (c) in FIG. 14, Pt was formed by the sputtering vapor depositing method into a film having a thickness of 50 nm on the entire surface to form a plating electrode layer 25. The peeling layer 24 has only a weak adherence with Pt, so that the peeling layer 24 can be peeled off from the interface with the plating electrode layer 25 in a subsequent step.

Thereafter, a resist pattern was formed so as to expose a portion for the formation of a micro-tip on the plating electrode layer 25, and with this as a mask, a Pt layer (micro-tip material layer) 26 was formed into a thickness of 500 nm by the electrolytic plating method (refer to (d) in FIG. 14).

With Pt-270 (made by N.E. Chemcat Company) as a plating solution, plating was carried out at a film forming rate of 20 nm/min. After plating, the resist was removed by dissolution (refer to (e) in FIG. 14).

Then, a silicon wafer was provided as a second substrate. A Cr film with a thickness of 5 nm and an Au film with a thickness of 100 nm were thin-film deposited in close succession by the vacuum vapor depositing method. The thus formed thin films were patterned by photolithography and etching to form a joining layer 27 (not shown).

Subsequently, the plating electrode layer 25 and the micro-tip material layer 26 on the first substrate 21 and the joining layer 27 on the second substrate were aligned and brought into contact with each other.

Upon bringing these layers into contact, Pt comprising the micro-tip material layer 26 and Au of the joining layer 27 were bonded together by applying pressure against the back surfaces of the first and second substrates (refer to (f) in FIG. 14).

By peeling off the peeling layer 24 from the interface with the plating electrode layer 25, only the plating electrode layer 25 on the peeling layer 24 and the micro-tip material layer 26 were transferred onto the joining layer 27, and thus, a micro-tip 29 as shown in (g) in FIG. 14 could be manufactured.

At this point, the portion of the plating electrode layer 25 on which the micro-tip material layer 26 was not formed remained on the first substrate side, not transferred onto the second substrate side.

The micro-tip 29 prepared by the foregoing method was observed with an SEM (scanning electron microscope): it was confirmed that the distal end portion had a replicated shape of the reversed pyramid shape formed by crystal axis anisotropic etching of silicon, and the distal end of the micro-tip was formed into a sharp shape, having a radius of curvature of up to 30 nm.

An STM apparatus using the micro-tip 29 of this Example was prepared. A block diagram of the thus prepared apparatus is illustrated in FIG. 15.

Figure 15:
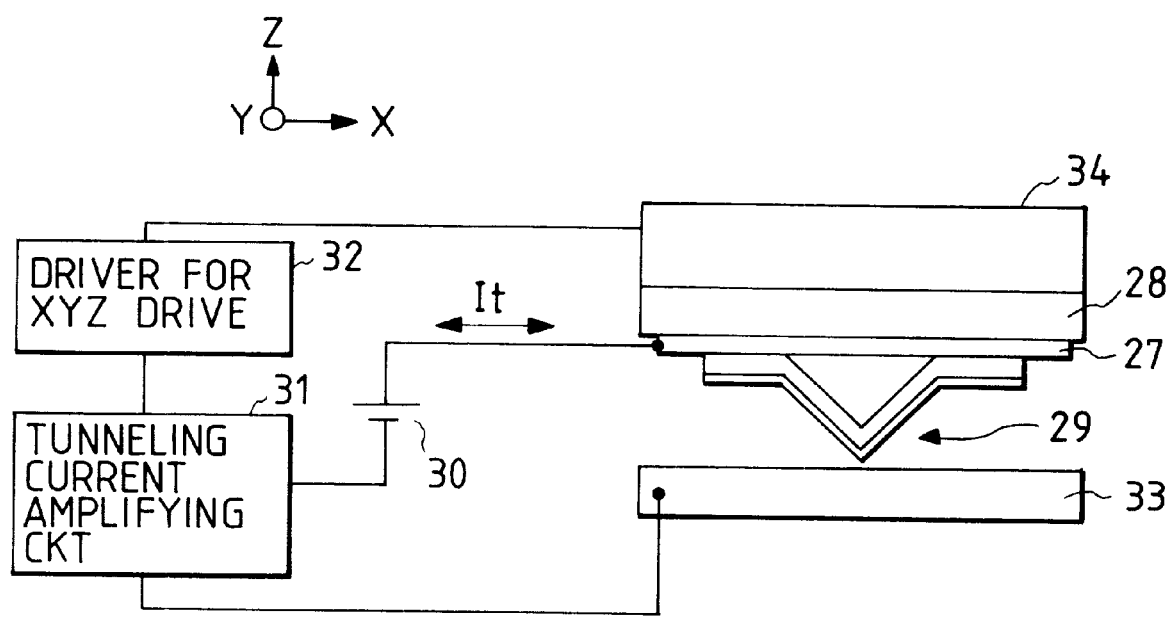
FIG. 15 is a block diagram of an STM apparatus using the micro-tip according to the eighth embodiment of the present invention.
Figure 16A:
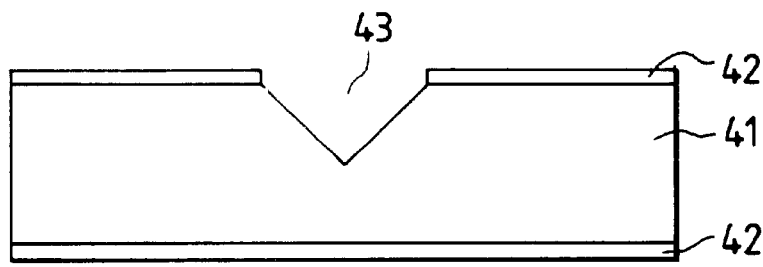
FIG. 16 is a sectional view illustrating steps of a method of manufacturing a micro-tip and a probe according to a ninth embodiment of the present invention.
Figure 16B:
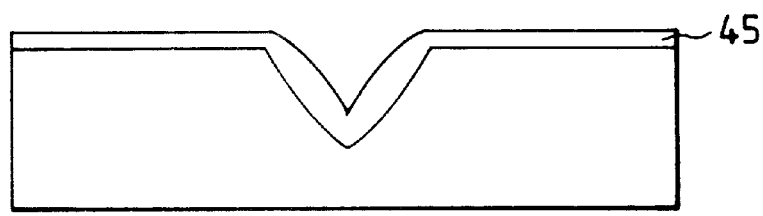
Figure 16C:
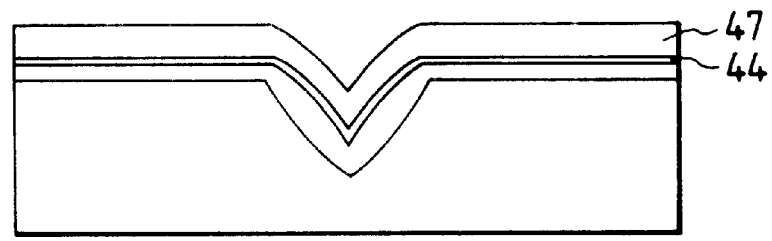
Figure 16D:
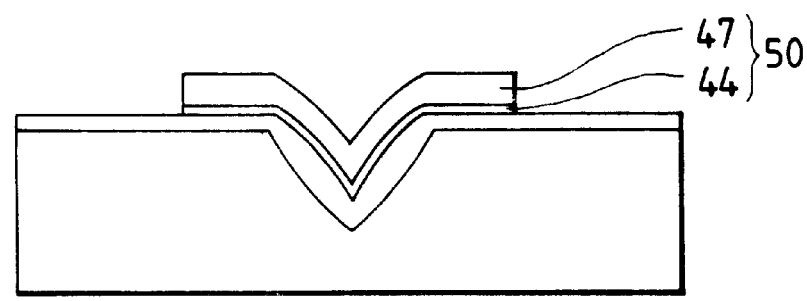

In FIG. 15, 30 is a power source for bias application, 31 is a tunneling current amplifying circuit, 32 is an XYZ driver, 28 is a second substrate, 27 is a joining layer, 29 is a micro-tip, 33 is a sample, and 34 is an XYZ-axis drive piezo element.

Tunneling current It flowing between the micro-tip 29 and the sample 33 is detected via the function layer 27, Feedback is applied so as to give a constant It, and the XYZ-axis drive piezo element 34 is driven in the Z-direction to keep a constant distance between the micro-tip and the sample.

The joining layer was used as an electrode for taking out tunneling current. By driving the XY-directions of the XYZ-axis drive piezo element 34, an STM image which is a two-dimensional image of the sample 33 can be observed.

The cleavage plane of an HOPG (high orientation pyrolysis graphite) substrate as a sample 33 was observed on this apparatus with a bias current of 1 nA and a scanning area of 100 Å×100 Å: a satisfactory atomic image was obtained with a high reproducibility.

EXAMPLE 9

In Example 9, the manufacturing methods of a micro-tip for MFM having a micro-tip comprising a CoPt magnetic layer having a high coercive force provided on a thin-film cantilever, and a probe having such a micro-tip are described.

Figure 17E:
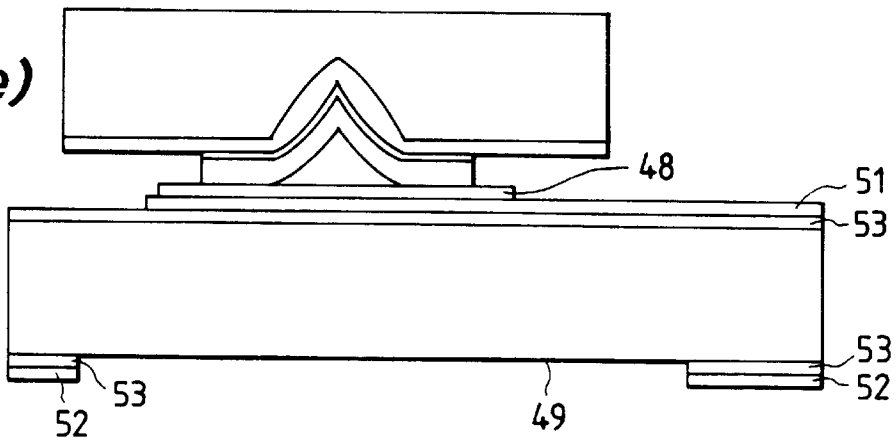
FIG. 17 is another sectional view illustrating steps of the method of manufacturing the micro-tip and the probe according to the ninth embodiment of the present invention.
Figure 17F:
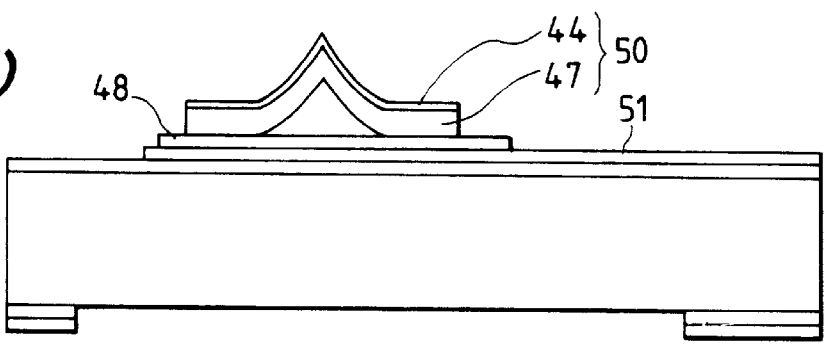
Figure 17G:
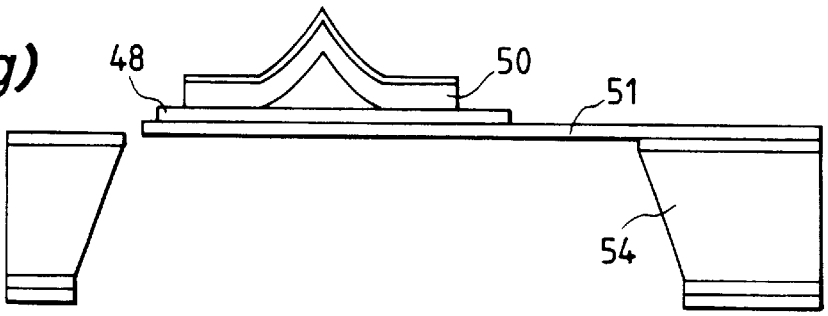

FIGS. 16 and 17 are sectional views illustrating the steps of the manufacturing methods of the micro-tip for MFM and the probe of the present invention.

Figure 18A:
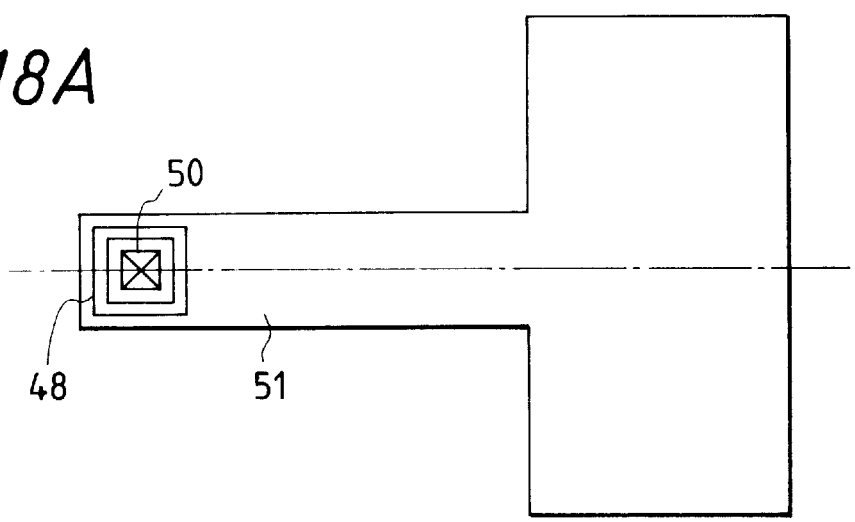
FIG. 18A is a top view illustrating a probe for MFM in the ninth embodiment of the present invention.
Figure 18B:
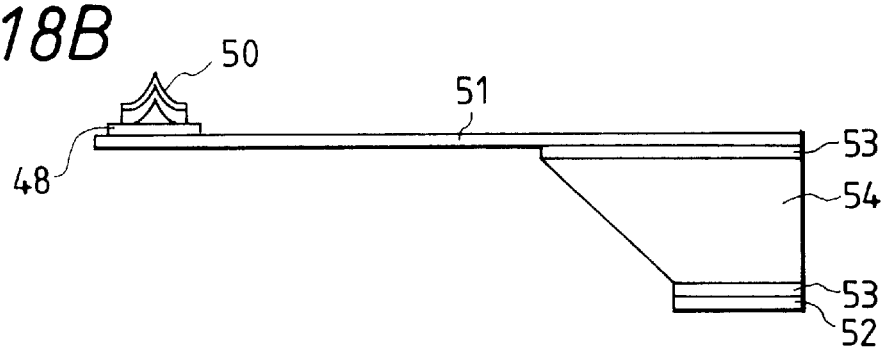
FIG. 18B is a side view thereof.

A top view of a manufactured probe is illustrated in FIG. 18A, and a side view thereof, in FIG. 18B. A thin-film cantilever 51 supported by a silicon block 54 comprising a silicon nitride film was employed as a thin-film cantilever.

In FIGS. 18A and 18B, 48 is a joining layer comprising Ti and Pt, 50 is a micro-tip comprising a CoPt magnetic member coated with a Pt film, 53 is a silicon dioxide film, and 52 is a silicon nitride film used as a mask upon etching the silicon wafer from the back.

In (a) in FIG. 16, a silicon wafer, having a crystal plane orientation <100>, having a protective layer 42 comprising a silicon dioxide film formed through thermal oxidation with an oxidizing gas, formed thereon, is provided as a first substrate 41. With a photoresist formed by the photolithographic process as a mask, a desired portion of the protective layer 42 was etched with an aqueous HF solution to expose an area of 8 $\mu m^2$ of silicon.

The protective layer 42 is a protective layer upon forming the recess serving as a female mold for the micro-tip through crystal-axis anisotropic etching, and has an etching resistance against the crystal-axis anisotropic etchant.

After peeling of the photoresist, the first substrate was subjected to crystal-axis anisotropic etching in an aqueous solution of potassium hydroxide having a concentration of 27% at a liquid temperature of 80° C., thereby forming a reverse pyramid-shaped recess 43 comprising crystal planes (111) with a depth of 5.6 $\mu$m.

Then, after removing the protective layer 2 by etching with an aqueous HF solution, the silicon substrate containing the recess 43 was subjected to a thermal oxidation process using an oxidizing gas, thus forming a peeling layer 45 comprising a silicon dioxide film of 5,000 Å (refer to (b) in FIG. 16).

By forming the silicon dioxide film through thermal oxidation of the surface of the first substrate containing the recess, it is possible to reduce the radius of curvature of the micro-tip distal end of the female mold for forming the micro-tip. This utilizes the difference in thickness of the silicon dioxide film upon thermal oxidation, depending upon the shape of silicon. By controlling the thickness of the thermally oxidized silicon dioxide film, therefore, it is possible to control the radius of curvature of the micro-tip.

Then, as shown in (c) in FIG. 16, Pt was formed into a Pt film 44 having a thickness of 100 Å on the entire surface of the peeling layer by the vacuum vapor depositing method, and a CoPt ferromagnetic member serving as a micro-tip material was formed into a film having a thickness of 500 nm on the entire surface by the sputtering method to form a magnetic layer 47.

The Pt film 44 and the peeling layer 45 comprising the silicon dioxide film 45 have a low adherence, and the peeling layer can be peeled off from the interface with the Pt film in a subsequent process.

Then, a resist was applied, and patterned by the photolithographic process for exposure and development. With this photoresist as a mask, the Pt film 44 and the magnetic layer 47 were subjected to ion milling by using Ar ions, and the photoresist was thus removed, thereby forming a micro-tip 50 before transfer through patterning as shown in (d) in FIG. 16.

A silicon wafer was used as a second substrate 49 having a thin-film cantilever formed thereon.

The second substrate comprises a thin-film cantilever 51 comprising a silicon nitride film, a silicon nitride film 52 formed by patterning a portion of the back of the thin-film cantilever, and a silicon wafer having a silicon dioxide film 53 formed thereon.

A Ti film having a thickness of 50 Å and a Pt film having a thickness of 1,000 Å were thin-film-deposited in close succession on the free end of the thin-film cantilever 51, and patterned by photolithography and etching to form a joining layer 48.

Subsequently, the magnetic layer 47 on the first substrate 41 and the joining layer 48 on the second substrate 49 were aligned and bonded (refer to (e) in FIG. 17).

Bonding was accomplished by a method of pressure-bonding by applying pressure onto the back surfaces of the first and second substrates. This achieves metallic bond of Pt and CoPt and bonding of the magnetic layer 47 and the joining layer 48. By separating the first substrate from the second substrate after contact, the micro-tip 50 is peeled off from the interface between the peeling layer 45 comprising the silicon dioxide film on the first substrate and the Pt film 44, thus permitting transfer of the micro-tip 50 comprising the ferromagnetic member having the Pt film 44 as shown in (f) in FIG. 17 onto the joining layer 48.

Thereafter, silicon was etched from the back side of the second substrate through crystal-axis anisotropic etching using an aqueous solution of potassium hydroxide, and the silicon dioxide film was removed from the back side with an aqueous HF solution.

Thus, there could be formed a probe having a micro-tip 50 on the joining layer at the free end of the thin-film cantilever 51 of which an end is fixed to the silicon block 24 (refer to (g) in FIG. 17).

In the probe for MFM manufactured by the manufacturing method of the present invention, the adverse effect of the leak magnetic field on the magnetic layer on the cantilever, a conventional problem, was successfully avoided by forming the magnetic micro-tip only on the free end of the cantilever.

For the reasons as described above, the thin-film cantilever never suffered warp caused by the film stress of the magnetic layer.

In the probe of the present invention, reflection of the laser for measurement of displacement can be accomplished on the back of the joining layer provided at the distal end of the thin-film cantilever, in replacement of a reflection film.

As the surface of the magnetic layer is coated with the Pt film, oxidation of the magnetic layer could be prevented. Other materials for preventing oxidation of the magnetic layer surface include those capable of peeling off from the interface with the peeling layer upon transfer of the micro-tip onto the second substrate. It is needless to mention that the Pt film to prevent oxidation can be made thinner by adjusting the film thickness during the process shown in (c) in FIG. 16.

The micro-tip 10 prepared in accordance with the present invention was observed with an SEM (scanning electron microscope). It was confirmed that the distal end portion thereof had a replicated shape of the reverse pyramid shape formed through crystal-axis anisotropic etching of silicon, and the distal end was sharply shaped, with a radius of curvature of the distal end of the micro-tip of up to 0.03 $\mu$m.

The thus prepared micro-tip had a hollow space between the tip and the joining layer.

When the micro-tip is provided at the free end of a thin-film cantilever or the like, the weight is reduced to about a half that of a micro-tip having the same height as shown in FIG. 12, and the decrease in the resonance frequency of the cantilever with a micro-tip could be inhibited.

The leak magnetic field distribution of a photomagnetic disk comprising TbFeCo was observed with the use of the probe of the present invention.

This observation was accomplished by bringing the probe closer to the photomagnetic disk, and detecting a change in resonance frequency of the probe by means of a position sensor detecting a change in the reflection angle of light from the joining layer caused by a deflection displacement of the thin-film cantilever (frequency modulation (FM) detecting method), thereby measuring the magnetic field distribution of the photomagnetic disk.

As a result, it was possible to observe the magnetic domain of the photomagnetic disk.

Since only the micro-tip has a magnetic layer in this Example, the leak magnetic field suffered by the micro-tip upon bringing the cantilever closer to the sample is small, thus permitting reduction of noise in the detection signal. As a magnetic layer is not formed on the cantilever, it is possible to reduce warp of the cantilever, and to inhibit the decrease in the detection sensitivity of magnetic force.

EXAMPLE 10

Figure 19A:
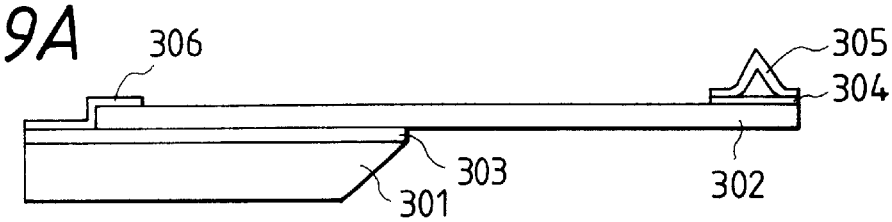
FIG. 19A is a sectional view of the probe of the present invention.
Figure 19B:
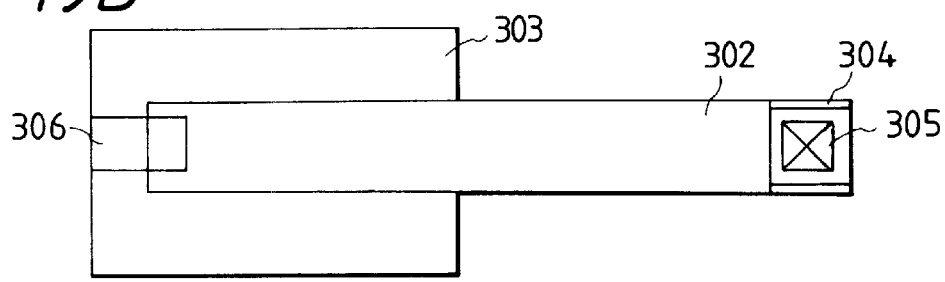
FIG. 19B is a top view thereof.
Figure 20A:
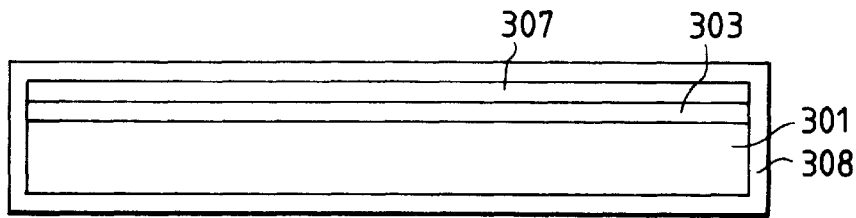
FIG. 20 illustrates manufacturing steps of the probe of the present invention.
Figure 20B:
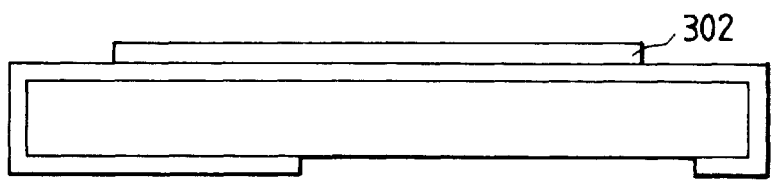
Figure 20C:
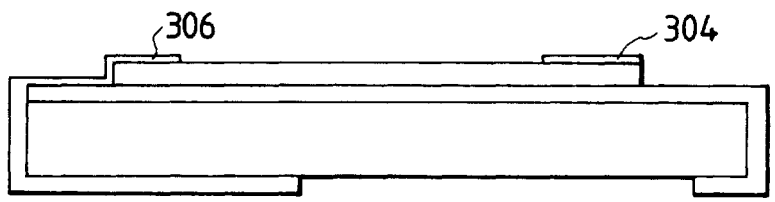
Figure 20D:
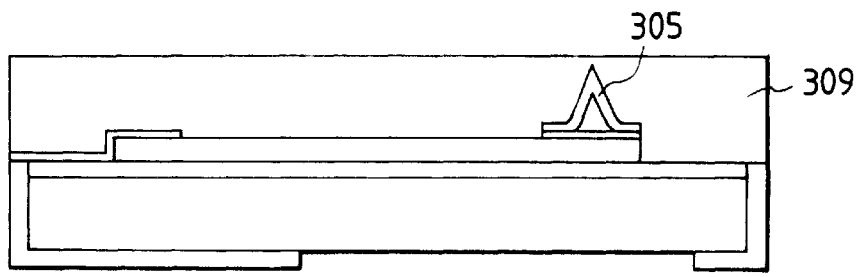
Figure 20E:
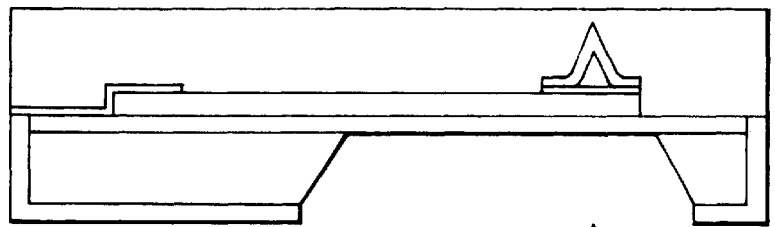
Figure 20F:
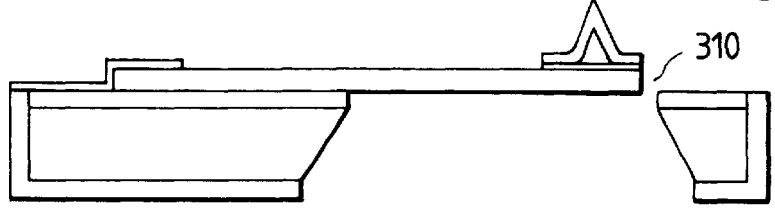
Figure 21A:
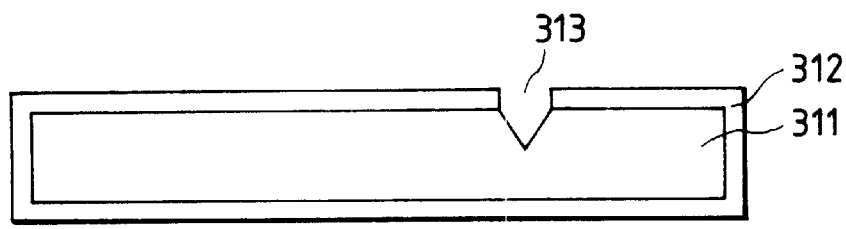
FIG. 21 illustrates manufacturing steps of the probe of the present invention.
Figure 21B:
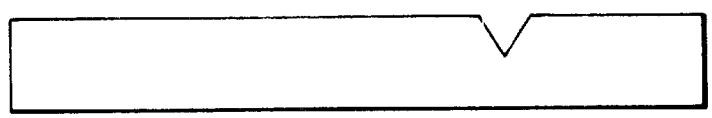
Figure 21C:
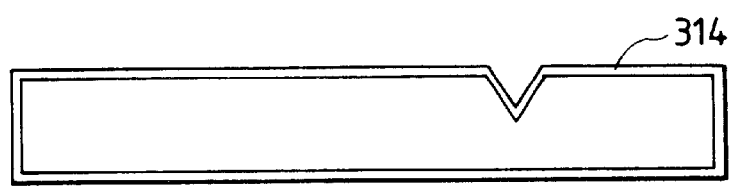
Figure 21D:
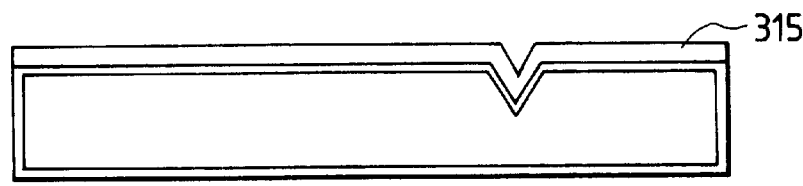
Figure 21E:
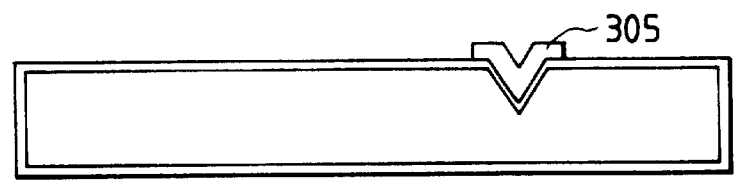

Example 10 covers a probe using an SOI substrate of the present invention. FIGS. 19A and 19B illustrate a sectional view and a top view of the probe of this Example. A monocrystal Si substrate 301 and a lever 302 comprising monocrystal Si are arranged via an Si oxide film 303. The lever 302 comprising monocrystal Si contains impurities doped therein for taking out tunneling current. A metallic micro-tip 305 is formed through a joining layer 304 on the distal end portion of the lever 302. A metal wiring 306 is formed at the other end of the lever 302.

A silicon nitride (SiN) film 308 was formed into a thickness of 0.2 $\mu$m by the LP-CVD (low-pressure chemical vapor deposition) method on an SOI (silicon on insulator) having an Si oxide film 303 having a thickness of 0.5 $\mu$m and an Si monocrystal film 307 having the thickness of 1.0 $\mu$m formed on an Si substrate 301 of a plane orientation (100) (refer to (a) in FIG. 20). An Si monocrystal film 307 having a resistance value of up to 0.01 $\Omega$.cm was used.

Then, a resist pattern was formed on the back side to etch the Si substrate 303, and the SiN film 308 was patterned by dry etching using CF4 gas.

Subsequently, the SiN film 308 on the surface was completely removed by etching, and then, the Si monocrystal film 307 was patterned into a lever shape 302 by photolithography and etching (refer to (b) in FIG. 20).

The lever had a rectangular shape having a length of 300 $\mu$m and a width of 60 $\mu$m. Then, a joining layer 304 comprising Pt was formed by photolithography and sputtering vapor deposition.

Simultaneously, an electrode wiring 306 for taking out tunneling current was formed on the other end of the lever 302 (refer to (c) in FIG. 20).

Thereafter, a micro-tip was formed.

An Si oxide film 312 having a thickness of 0.1 $\mu$m was formed on an Si substrate 311 of a plane orientation (100). This Si oxide film 312 was subjected to photolithography and etching to form an opening having a diameter of 6 $\mu$m.

This substrate was subjected to crystal-axis anisotropic etching by the use of an aqueous solution of potassium hydroxide to form a reverse pyramid-shaped recess 313 at the opening portion (refer to (a) in FIG. 21).

Then, the substrate was immersed in a BHF solution to remove the Si oxide film 312 by dissolution (refer to (b) in FIG. 21).

Then, this substrate was heat-treated in an oxidizing atmosphere to form a 100 nm-thick Si oxide film 314 on the entire surface of the substrate (refer to (c) in FIG. 21).

Thereafter, Au 315 which was a micro-tip material was formed into a film having a thickness of 1 $\mu$m on the substrate (refer to (d) in FIG. 21), and this film 315 was patterned by photolithography and etching, thereby forming a micro-tip 305 (refer to (e) in FIG. 21).

Then, the substrate having the lever 302 formed thereon and the substrate having the micro-tip 305 formed thereon were aligned, and at the point where the joining layer 304 on the lever 302 and the micro-tip 305 were aligned, pressure was applied to the both substrates to bond them together (refer to (a) in FIG. 22).

After bonding, the two substrates were separated: the micro-tip 305 was satisfactorily formed on the joining layer 304 (refer to (b) in FIG. 22).

Then, a polyimide layer 309 serving as a protective layer having a thickness of 5 $\mu$m was formed on the lever 302 of the substrate and the micro-tip 305 forming surface (refer to (d) in FIG. 20).

Thereafter, the back surface of the substrate was immersed in an aqueous solution of potassium hydroxide and crystal-axis anisotropic etching was carried out (refer to (e) in FIG. 20).

After the completion of etching, the exposed Si oxide film 303 was removed by dissolution in a BHF solution. Then, an oxygen plasma treatment was carried out to remove the polyimide layer 309, and a gap was formed on the back of the lever 302, thereby obtaining a probe 310 of the present invention (refer to (f) in FIG. 20).

In this Example, nine probes (in a 3×3 matrix) were formed on a single substrate. Measurement by a laser microscope detected no warp in longitudinal or transverse direction of the lever in any one of these probes.

This is attributable to the fact that the lever itself is monocrystalline, and the substrate holding the lever is of the same Si monocrystal, suggesting that an excessive stress which may lead to breakage of the lever does not act.

EXAMPLE 11

An SiN film 308 having a thickness of 0.2 $\mu$m was formed on an SOI substrate, as in Example 10 (refer to (a) in FIG. 20).

An Si monocrystal film 307 having a resistance value of up to 0.01 $\Omega$.cm was used.

Then, the SiN film 308 on the back side was patterned, and the SiN film 308 on the surface was completely removed by etching. Thereafter, the Si monocrystal film 307 was patterned in the lever 302 shape by photolithography and etching (refer to (b) in FIG. 20).

The lever had a rectangular shape with a length of 200 $\mu$m and a width of 50 $\mu$m. Then, a joining layer 304 comprising Al was formed on the distal end portion of the lever 302 by photolithography and sputtering vapor deposition.

Simultaneously with this, an electrode wiring 306 for taking out tunneling current was formed at the other end of the lever 302 (refer to (c) in FIG. 20).

Subsequently, a micro-tip 305 was formed in the same manner as in Example 10.

Pt was used as the tip material. Then, the substrate having the lever 302 formed thereon and the substrate having the micro-tip 305 formed thereon were aligned, and at the point where the joining layer 304 on the lever 302 and the micro-tip 305 were aligned, the two substrates were bonded together by applying pressure onto the both substrates (refer to (a) in FIG. 22).

After bonding, the two substrates were separated: the micro-tip was satisfactorily formed on the joining layer 304 (refer to (b) in FIG. 22).

Then, a polyimide layer 309 having a thickness of 5 μm serving as a protective film was formed on the lever 302 of the substrate and the micro-tip 305 forming surface (refer to (d) in FIG. 20).

Subsequently, the back surface of the substrate was immersed in an aqueous solution of potassium hydroxide to carry out crystal-axis anisotropic etching (refer to (e) in FIG. 20).

After the completion of etching, the exposed Si oxide film 303 was removed by dissolution in a BHF solution. Then, an oxygen plasma treatment was carried out to remove the polyimide layer 309, and a gap was formed on the back of the lever 302, thereby obtaining a probe 310 of the present invention (refer to (f) in FIG. 20).

In this Example, 16 probes (in a 4×4 matrix) were formed on a single substrate. Measurement by a laser microscope detected no warp in longitudinal or transverse direction of the lever in any of these probes.

EXAMPLE 12

An SiN film 308 having a thickness of 0.2 μm was formed on an SOI substrate, as in Example 10 (refer to (a) in FIG. 20).

An Si monocrystal film 307 having a resistance value of up to 0.005 Ω.cm was used. Then, the SiN film 308 on the back side was patterned, and the SiN film 308 was completely removed by etching. Thereafter, the Si monocrystal film 307 was patterned in the lever 302 shape by photolithography and etching (refer to (b) in FIG. 20).

The lever had a rectangular shape with a length of 150 μm and a width of 50 μm. Then, a joining layer 305 comprising an Au (upper) and a Pt (lower) films was formed on the distal end portion of the lever 302 by photolithography and sputtering vapor deposition. Simultaneously with this, an electrode wiring 306 for taking out tunneling current was formed at the other end of the lever 302 (refer to (c) in FIG. 20).

Subsequently, a micro-tip 305 was formed in the same manner as in Example 10, using Ir as the material for the micro-tip.

Then, the substrate having the lever 302 formed thereon and the substrate having the micro-tip 305 formed thereon were aligned, and at the point where the joining layer 304 on the lever 302 and the micro-tip 305 were aligned, the two substrates were bonded together by applying pressure onto the both substrates (refer to (a) in FIG. 22).

After bonding, the two substrates were separated: the micro-tip was satisfactorily formed on the joining layer 304 (refer to (b) in FIG. 22).

Then, a polyimide layer 309 having a thickness of 5 μm serving as a protective film was formed on the lever 302 of the substrate and the micro-tip 305 forming surface (refer to (d) in FIG. 20).

Subsequently, the back surface of the substrate was immersed in an aqueous solution of potassium hydroxide to carry out crystal-axis anisotropic etching (refer to (e) in FIG. 20).

After the completion of etching, the exposed Si oxide film 303 was removed by dissolution in a BHF solution. Then, an oxygen plasma treatment was carried out to remove the polyimide layer 309, and a gap was formed on the back of the lever 302, thereby obtaining a probe 310 of the present invention (refer to (f) in FIG. 20).

In this Example, 16 probes were formed on a single substrate. Measurement by a laser microscope detected no warp in longitudinal or transverse direction of the lever in any of these probes.

EXAMPLE 13

An information recording/reproduction apparatus using a probe manufactured in the same manner as in Example 10 will be described below.

Figure 23:
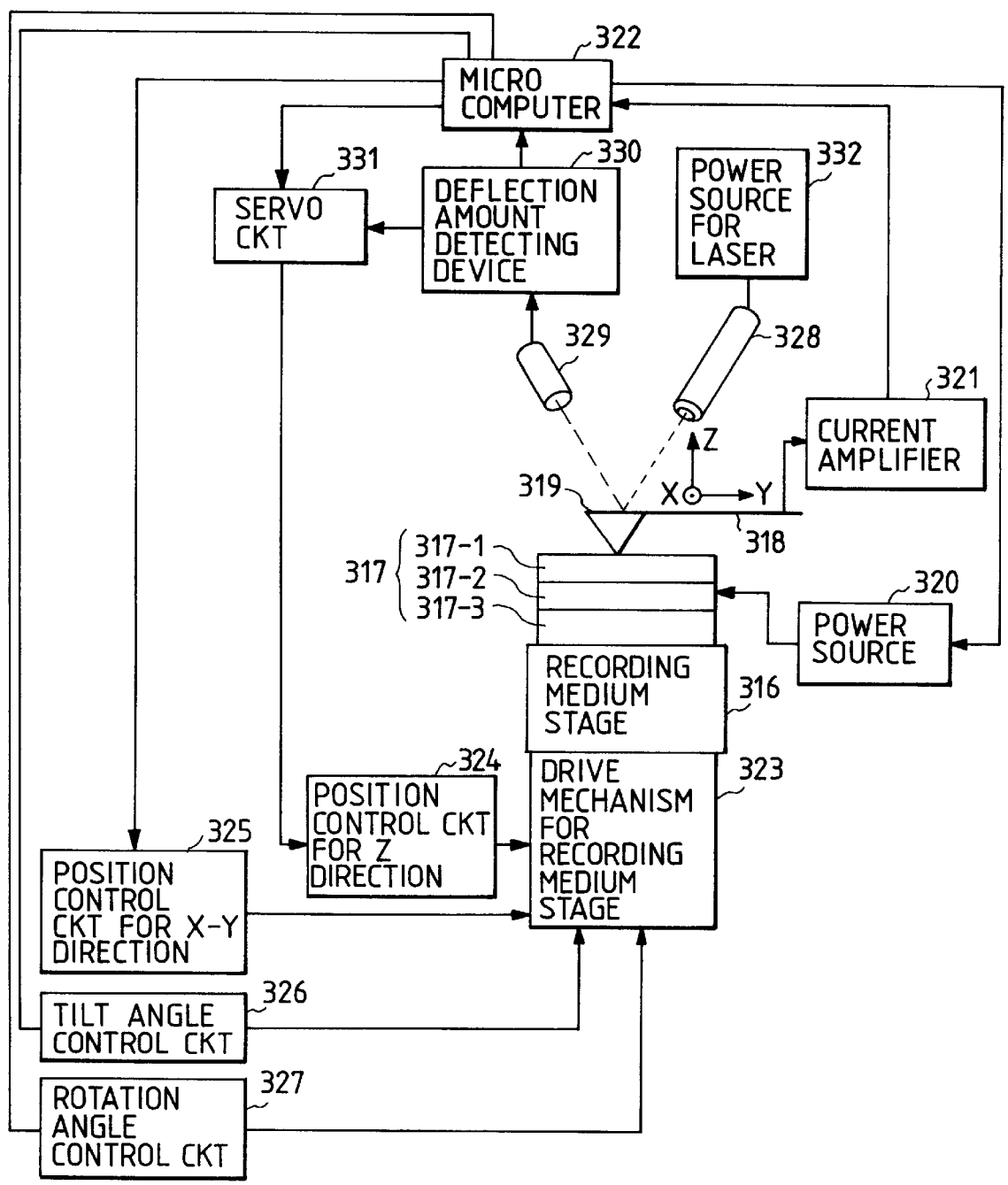
FIG. 23 is a schematic view illustrating the information recording/reproduction apparatus of the present invention.

FIG. 23 illustrates a main configuration and a block diagram of the present invention. The apparatus will be described with reference to FIG. 23.

A probe 318 was arranged opposite to a recording medium 317 on a recording medium stage 316.

In FIG. 23, 317-1 is an information recording layer, and a lower electrode 317-2 was for applying voltage to the information recording layer 317-1.

In FIG. 23, 317-3 is a substrate. The information recording layer 317-1 comprises an organic thin film and the like, of which electrical properties change (electric memory effect) under the effect of tunneling current produced between the recording layer and a micro-tip 319; 320 is a power source, and 321 is a current amplifier which is connected to a microcomputer 322 and used for recording and reproducing information to the recording medium. The recording medium stage 316 on a recording medium stage driving mechanism 323 is controlled by a Z-direction position control circuit 324, an X-Y direction position control circuit 325, a tilt angle control circuit 326 and a rotation angle control circuit 327 under the control of the microcomputer 322. A laser 328 is irradiated onto the distal end of a probe 318. The reflection light is received by a two-division sensor 329, and a deflection amount detecting device 333 detects the amount of deflection of the probe 318.

This information is sent to the microcomputer 322 and a servo circuit 331. The recording medium 317 of the present Example was manufactured by vapor-depositing Au into a thickness of 30 nm as a lower electrode 317-2 by the vacuum vapor depositing method on a quartz glass substrate 317-3, and then, forming a polyimide layer (information recording layer 317-1) thereon by the LB (Langmuir Brojet) method as the lower electrode 317-2.

A probe 318 and a recording medium 317 prepared in Example 10 were installed in the foregoing recording/reproduction apparatus, and recording and reproduction were carried out in accordance with the principle and the method disclosed in Japanese Patent Application Laid-open No. 63-161552.

First, the recording medium 317 was observed by means of the above-mentioned probe 318. Satisfactory AFM images could be obtained for all the probes 318, and no damage to the recording medium 317 such as film peeling was observed.

Then, voltage was applied in pulse manner between the micro-tip 319 and the lower electrode 317-2 while scanning the recording medium, with the use of the recording medium stage 316. Application of voltage of 3V was conducted in a rectangular pulse with a width of 50 ns.

After application of pulse, the recording medium was scanned with DC voltage of 200 mV: a change in properties took place at the pulse application point of the information recording layer 317-1, resulting in a portion with a lower electric resistance. This portion with a lower electric resistance, i.e., the recording bit had a diameter of about 10 nm. Recording and reproduction could be accomplished by any of the probes 318.

EXAMPLE 14

A torsion-type lever 333 was formed on an SOI substrate in the same manner as in Example 10.

Figure 24A:
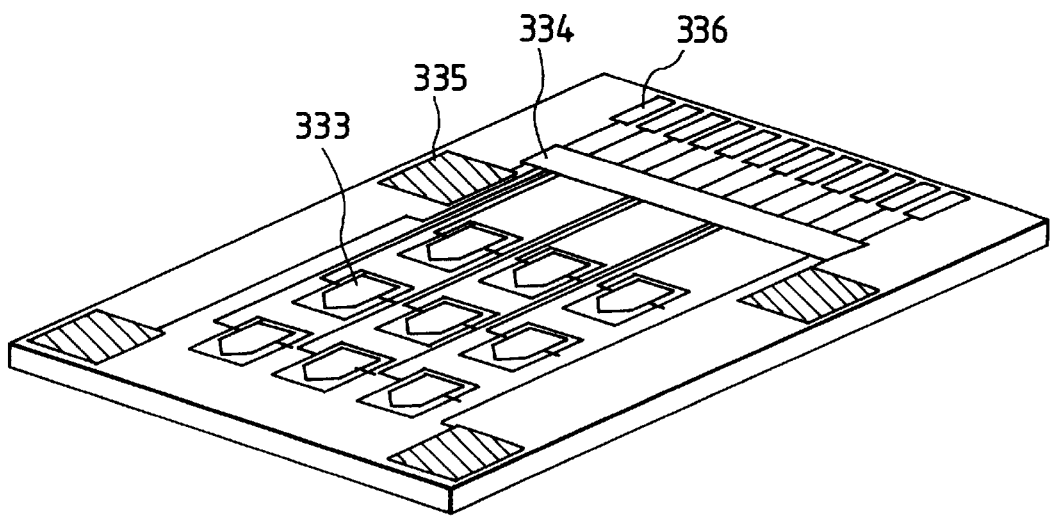
FIG. 24A is a schematic perspective view illustrating the probe unit of the present invention.
Figure 24B:
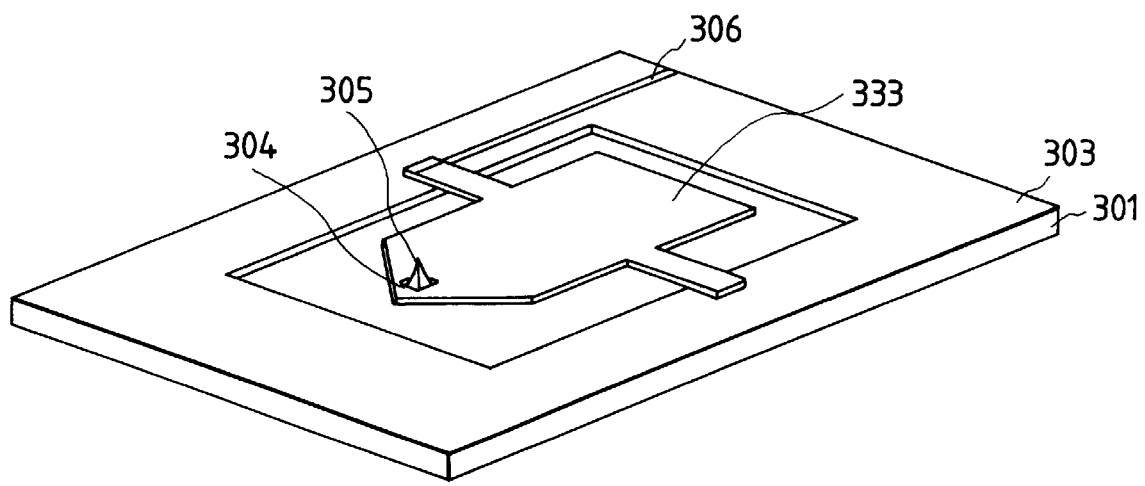
FIG. 24B is a detailed perspective view of the configuration of the probe shown in FIG. 24A.

A schematic view of the probe unit is illustrated in FIG. 24A, and the configuration of the probe is shown in FIG. 24B. The lever had a length of 300 μm and a width of 150 μm. A substrate 301 has a through-hole at a position corresponding to its lever 333, and a signal processing IC 334, an aligning mechanism 335 and a signal takeout pad 336 are formed within the same substrate (refer to FIG. 24A).

Recording and reproduction were conducted in the same manner as in Example 13 with the use of this probe unit: recording and reproduction could be satisfactorily accomplished by any of the probes.

According to the present invention, as described above, it is possible to uniformly form a micro-tip having a light and strong shape and a sharp distal end with a high reproducibility, easily achieve a multi-probe of micro-tips, and to realize a method of manufacturing a micro-tip excellent in properties for detecting tunnel current, micro-force or magnetic force, a female mold substrate for its manufacture, a method of manufacturing a probe having such a micro-tip, such a probe, a probe unit having such a probe, a scanning probe microscope, and an information recording/reproduction apparatus.

By forming this micro-tip from a metal material, a stable micro-tip having a further higher reproducibility for STM is available. Even when forming a plurality of micro-tips, it is possible to achieve uniform radii of curvature of the distal ends thereof, and thus to achieve a multi-probe.

In the method of manufacturing the micro-tip of the present invention, the micro-tip can be formed without removing a female mold substrate which is the first substrate by etching during the manufacturing process. It is therefore possible to reuse the female mold repeatedly, resulting in improvement of productivity and reduction of manufacturing cost.

Because the micro-tip is formed, not by etching, but by transfer, deterioration of the material or shape of the micro-tip or contamination caused by etchant can be prevented.

When adopting a construction in which a thin-film cantilever having a joining layer on the second substrate is previously prepared, it becomes easier to prepare a probe for AFM comprising a thin-film cantilever having a micro-tip, and the necessity is eliminated of forming a reflection film by forming the joining layer only on the distal end portion of the thin-film cantilever. Warp of the thin-film cantilever often caused by the formation of a reflection film can be avoided.

By using a construction in which a joining layer comprising a resin film is formed on the second substrate, with the bonded and shape-adjusted third substrate, and a flat thin film is previously formed, it is possible to easily manufacture a probe having functions of an electrostatic actuator for AFM or STM.

Because the twist beam and the flat thin film for AFM or STM as described above are made of crystal silicon, it is possible to manufacture a probe free from warp with a high reproducibility.

Since the second and third substrates are bonded to the resin film serving as the bonding layer and the layer takes charge of a sacrificial layer to be removed at the final stage of manufacturing process, it is possible to use dry etching based on oxygen gas for the removal of the resin film, thus permitting avoidance of sticking which has been a difficulty in the conventional removal of the sacrificial layer.

Because of the presence of this resin film, it is possible to form a flat surface, not being affected by surface irregularities caused by electrode pattern or the like formed on the substrate, and accomplish satisfactory bonding, irrespective of the surface roughness of the substrate.

According to the present invention, furthermore, the micro-tip alone can be formed at the distal end of the cantilever. This eliminates the necessity of forming a reflection film on the entire back surface of the probe, and the need for forming a magnetic layer on the entire surface of the probe when forming a micro-tip for detecting magnetic force, thus resulting in availability of any desired thickness of the magnetic layer.

According to the method of manufacturing a probe of the present invention, moreover, warp or breakage of the lever does not occur, and the floating capacitance produced between the probe and the medium can be reduced. It is thus possible to easily bond or form the micro-tip on the lever with a high reproducibility.

Because the lever and the signal processing IC are integrated on the monocrystal substrate, the signal processing speed is improved, and a compact probe unit can be easily manufactured.

What is claimed is:

1. A method of manufacturing a micro-tip for detecting tunneling current, micro force or magnetic force, which comprises the steps of:

forming a recess portion on the surface of a first substrate;

forming a peeling layer on said first substrate containing said recess of said first substrate;

forming a micro-tip on the peeling layer of said first substrate;

forming a joining layer on a second substrate; and transferring said micro-tip on the peeling layer containing said recess in said first substrate onto the joining layer on said second substrate;

wherein, said peeling layer mainly consists of an oxide or nitride, of a metal element, a semi-metal element or a semiconductor element.

2. A method according to claim 1, wherein said peeling layer comprises silicon dioxide.

3. A method according to claim 2, wherein said first substrate comprises silicon, and said silicon dioxide is formed by thermally oxidizing said first substrate.

4. A method according to claim 2, wherein said silicon dioxide has a film thickness of at least 500 nm.

5. A method according to claim 1, wherein said micro-tip comprises platinum or gold.

6. A method according to claim 1, wherein there are provided a plurality of said micro-tips.

7. A method according to claim 1, wherein the method further comprises the steps of:

forming an electrode layer for plating on the peeling layer of said first substrate; and forming a micro-tip by plating on said electrode layer for plating.

8. A method according to claim 1, wherein said micro-tip comprises a magnetic material.

9. A female mold substrate used for manufacturing a micro-tip for detecting tunneling current, micro-force or magnetic force, which comprises:
- a recess formed on the surface of said female mold substrate; and
- a peeling layer provided on said substrate containing said recess;
- wherein said peeling layer mainly consists of an oxide or nitride, of a metal element, a semi-metal element or a semiconductor element.

10. A female mold substrate according to claim 9, wherein said peeling layer comprises silicon dioxide.

11. A female mold substrate according to claim 9, wherein a plurality of said recesses are formed on said substrate.

12. A probe provided with a micro-tip for detecting tunneling current, micro-force or magnetic force, which comprises:
- a lever formed on a substrate;
- a joining layer formed on said lever; and
- a micro-tip formed on said joining layer;
- wherein a hollow space is present between said joining layer and said micro-tip.

13. A probe according to claim 12, wherein a plurality of said levers are formed on said substrate.

14. A probe according to claim 12, wherein said lever comprises monocrystal silicon.

15. A probe according to claim 12, wherein said micro-tip comprises a metal.

16. A probe according to claim 15, wherein said metal comprises Au, Pt, Ir, or an alloy thereof.

17. A probe according to claim 12, wherein said joining layer comprises a metal.

18. A probe according to claim 17, wherein the metal composing said joining layer comprises Pt or Al.

19. A probe according to claim 14, wherein said lever has an electric resistance of 0.01 Ω.cm or less.

20. A method of manufacturing a probe having a micro-tip for detecting tunneling current, micro-force or magnetic force, which comprises the steps of:
- forming a recess on the surface of a first substrate comprising silicon;
- forming a peeling layer on said first substrate containing the recess of said first substrate;
- forming a micro-tip on the peeling layer of said first substrate;
- forming a layer comprising an elastic material on a second substrate;
- forming a joining layer on the layer comprising the elastic material of said second substrate;
- transferring the micro-tip formed on said first substrate onto the joining layer on said second substrate; and
- removing part of said second substrate to form an elastic member comprising said elastic material;
- wherein said peeling layer mainly consists of an oxide or nitride, of a metal element, a semi-metal element or a semiconductor element.

21. A method according to claim 20, wherein said peeling layer comprises silicon dioxide.

22. A method according to claim 21, wherein silicon dioxide of said peeling layer is formed by thermally oxidizing said first substrate.

23. A method according to claim 21, wherein said silicon dioxide has a film thickness of at least 500 nm.

24. A method according to claim 20, wherein there are provided a plurality of said recesses, said micro-tips and said elastic members.

25. A method of manufacturing a probe having a micro-tip for detecting tunneling current, micro-force or magnetic force, which comprises the steps of:
- forming a recess on the surface of a first substrate comprising silicon;
- forming a peeling layer on the surface containing the recess of said first substrate;
- forming a micro-tip on the peeling layer of said first substrate;
- forming a joining layer comprising a resin film on a second substrate and/or on a third substrate having a beam pattern formed thereon;
- binding said second substrate and said third substrate together via said joining layer;
- shaping said third substrate into a flat thin film on said second substrate;
- forming a joining layer on said flat thin film;
- forming a supporting portion, which supports said flat thin film on said second substrate, on said second substrate;
- transferring the micro-tip on said first substrate onto the joining layer on said flat thin film; and
- removing the joining layer between said second substrate and said flat thin film, to form a gap between said flat thin film and said second substrate;
- wherein said peeling layer mainly consists of an oxide or nitride, of a metal element, a semi-metal element or a semiconductor element.

26. A method according to claim 25, wherein said third substrate comprises an SOI substrate.

27. A method according to claim 25, wherein there are provided a plurality of said micro-tips.

28. A method of manufacturing a probe having a micro-tip for detecting tunneling current, micro-force or magnetic force, which comprises the steps of:
- forming a recess on the surface of a first substrate comprising silicon;
- forming a peeling layer on the surface containing the recess of said first substrate;
- forming a micro-tip on the peeling layer of said first substrate;
- forming a lever comprising monocrystal Si through the peeling layer on a second substrate comprising a monocrystal Si material;
- forming a joining layer on said lever;
- transferring said micro-tip onto said joining layer; and
- removing said second substrate and the peeling layer on the back of said lever, to form a gap on the rear surface of said lever;
- wherein said peeling layer mainly consists of an oxide or nitride, of a metal element, a semi-metal element or a semiconductor element.

29. A method according to claim 28, wherein said micro-tip comprises Au, Pt, Ir or an alloy thereof.

30. A method according to claim 28, wherein said lever has an electric resistance of 0.01 Ω.cm or less.

31. A method according to claim 28, wherein said micro-tip is transferred through pressure-bonding.

32. A probe unit provided with a micro-tip for detecting tunneling current, micro-force or magnetic force, which comprises:
- a monocrystal Si substrate having a signal processing IC formed thereon;
- an insulating layer formed on said substrate;

a lever comprising monocrystal Si partially supported by said insulating layer;

a micro-tip, comprising a metal, arranged on said lever through a joining layer; and an electric wiring for transmitting a signal detected by said micro-tip to said IC, wherein a hollow space is present between said micro-tip and said joining layer.

33. A probe unit according to claim 32, wherein said monocrystal Si substrate has a through-hole made by crystal axis anisotropic etching at a position opposite to said lever.

34. A probe unit according to claim 32, wherein said micro-tip comprises Au, Pt, Ir, or an alloy thereof.

35. A probe unit according to claim 32, wherein said lever has an electric resistance of 0.01 Ω.cm or less.

36. A scanning probe microscope scanning a sample with a probe, and detecting a physical phenomenon occurring between said probe and said sample, thereby permitting observation of said sample, which comprises:

a probe unit according to claim 32.

37. An information recording/reproduction apparatus for recording and/or reproducing information with a recording medium, by scanning said recording medium with a probe and utilizing a physical phenomenon occurring between said probe and said recording medium, which comprises:

a probe unit according to claim 32.

* * * * *

UNITED STATES PATENT AND TRADEMARK OFFICE
CERTIFICATE OF CORRECTION

PATENT NO.    : 5,923,637
DATED         : July 13, 1999
INVENTOR(S)   : YASUHIRO SHIMADA ET AL.           Page 1 of 4

It is certified that error appears in the above-identified patent and that said Letters Patent is hereby corrected as shown below:

On title page, item
  [56] REFERENCES CITED

OTHER PUBLICATIONS

After "Magnetic Micro-Actuator":"Mechnical" should read --Mechanical--; and
    After "Physical Review Letters": "Microscope,"" should read --Microscopy,"--.

AT [57] ABSTRACT

Line 4, "are" should read --is--.

IN THE DRAWINGS

Figure 14A:
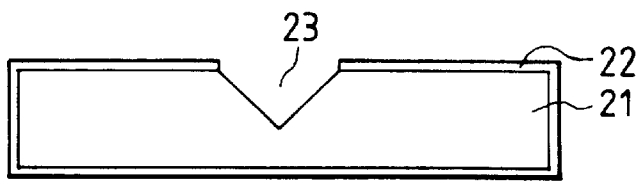
FIG. 14 illustrates steps of an eighth embodiment of the method of manufacturing the micro-tip of the present invention.
Figure 14B:
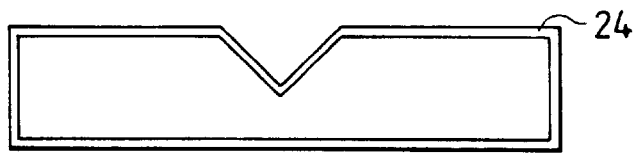
Figure 14C:
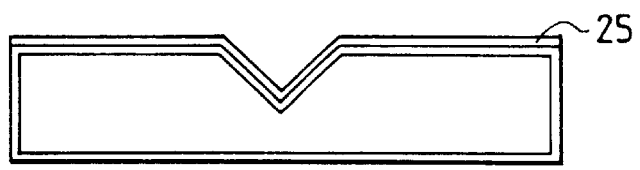
Figure 14D:
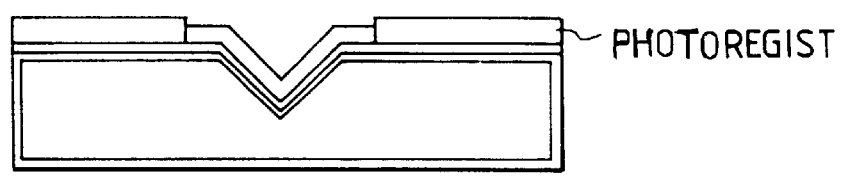
Figure 14E:
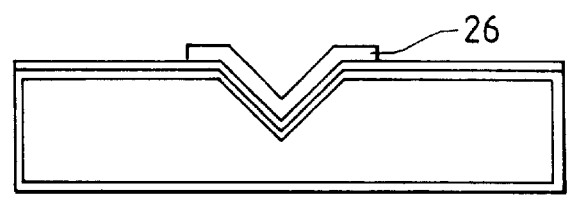
Figure 14F:
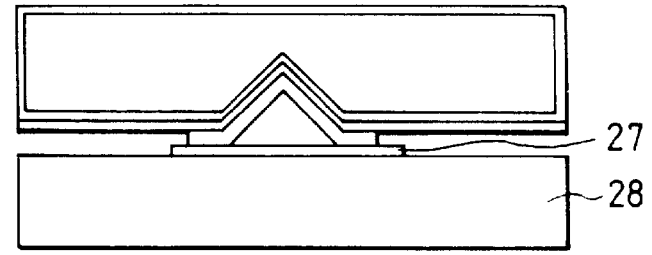
Figure 14G:
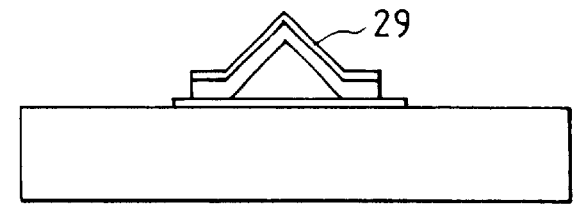

Sheet 13, FIG. 14(d), "PHOTOREGIST" should read --PHOTORESIST--.

COLUMN 4

Line 39, "suffers" should read --suffers from-- and "problem:" should read --problems:--.

COLUMN 5

Line 30, "stance;" should read --strate;--; and
    Line 36, "and trans-" should read and ¶ trans- --.

UNITED STATES PATENT AND TRADEMARK OFFICE
CERTIFICATE OF CORRECTION

PATENT NO. : 5,923,637

DATED : July 13, 1999

INVENTOR(S) : YASUHIRO SHIMADA ET AL.

It is certified that error appears in the above-identified patent and that said Letters Patent is hereby corrected as shown below:

COLUMN 9

Line 67, "boiling, water," should read --boiling water,--.

COLUMN 12

Line 22, "a" should read --an--.

COLUMN 13

Line 54, "composes" should read --comprises--.

COLUMN 15

Line 35, "from" should read --form--.

COLUMN 17

Line 9, "result," should read --results,--.

COLUMN 19

Line 36, "million" should read --milling--.

COLUMN 20

Line 65, "sat" should read --at--.

UNITED STATES PATENT AND TRADEMARK OFFICE
CERTIFICATE OF CORRECTION

PATENT NO.    : 5,923,637
DATED         : July 13, 1999
INVENTOR(S)   : YASUHIRO SHIMADA ET AL.

It is certified that error appears in the above-identified patent and that said Letters Patent is hereby corrected as shown below:

COLUMN 23

Line 22, "of" should read --off--; and
    Line 29, "layer 2" should read --layer 42--.

COLUMN 24

Line 29, "block 24" should read -- block 54--.

COLUMN 24

Line 53, "micro-tip 10" should read --micro-tip 50--.

COLUMN 25

Line 43, "CF4" should read --$CF_4$--.

COLUMN 28

Line 46, "(Langmuir Brojet)" should read --(Langmuir Blodgett)--.

COLUMN 30

Line 33, "micro force" should read --micro-force--.

UNITED STATES PATENT AND TRADEMARK OFFICE
CERTIFICATE OF CORRECTION

PATENT NO.    : 5,923,637
DATED         : July 13, 1999
INVENTOR(S)   : YASUHIRO SHIMADA ET AL.

It is certified that error appears in the above-identified patent and that said Letters Patent is hereby corrected as shown below:

COLUMN 31

Line 60, "silicon" should read --said silicon--.

Signed and Sealed this

Twenty-first Day of March, 2000

Attest:

Q. TODD DICKINSON

Attesting Officer

Commissioner of Patents and Trademarks